(12) United States Patent
Kim

(10) Patent No.: US 8,174,030 B2
(45) Date of Patent: May 8, 2012

(54) LUMINOUS DEVICES, PACKAGES AND SYSTEMS CONTAINING THE SAME, AND FABRICATING METHODS THEREOF

(75) Inventor: YuSik Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/111,229

(22) Filed: May 19, 2011

(65) Prior Publication Data

US 2011/0272726 A1    Nov. 10, 2011

Related U.S. Application Data

(62) Division of application No. 12/386,882, filed on Apr. 24, 2009, now Pat. No. 7,968,355.

(30) Foreign Application Priority Data

Apr. 25, 2008    (KR) .................. 10-2008-0038970

(51) Int. Cl.
    *H01L 27/15*    (2006.01)
    *H01L 31/12*    (2006.01)
    *H01L 33/00*    (2010.01)

(52) U.S. Cl. ................ 257/79; 257/82; 257/E33.001

(58) Field of Classification Search ............ 257/13, 257/59, 79, 82, 88, E31.127, E33.001
    See application file for complete search history.

(56) References Cited

U.S. PATENT DOCUMENTS

| 4,846,931 | A | 7/1989 | Gmitter et al. |
| 5,753,939 | A | 5/1998 | Sassa et al. |
| 5,777,350 | A | 7/1998 | Nakamura et al. |
| 5,959,307 | A | 9/1999 | Nakamura et al. |
| 6,040,588 | A | 3/2000 | Koide et al. |
| 6,172,382 | B1 | 1/2001 | Nagahama et al. |
| 7,112,456 | B2 | 9/2006 | Park et al. |
| 7,579,204 | B2 | 8/2009 | Nemoto |
| 2008/0278947 | A1* | 11/2008 | Ryu et al. ............... 362/249 |
| 2009/0267096 | A1 | 10/2009 | Kim |

OTHER PUBLICATIONS

"Luminous Devices, Packages and Systems Containing the Same, and Fabricating Methods Thereof" Specification, Drawings and Prosecution History, of U.S. Appl. No. 12/386,882, filed Apr. 24, 2009, by YuSik Kim.
Ha, Jun-Seok, et al., "The Fabrication of Vertical Light-Emitting Diodes Using Chemical LIft-Off Process", IEEE Photonics Technology Letters, vol. 20, No. 3, pp. 175-177, Feb. 1, 2008.I.

* cited by examiner

*Primary Examiner* — Hoai V Pham
(74) *Attorney, Agent, or Firm* — Onello & Mello, LLP

(57) ABSTRACT

The present invention is directed to a vertical-type luminous device and high through-put methods of manufacturing the luminous device. These luminous devices can be utilized in a variety of luminous packages, which can be placed in luminous systems. The luminous devices are designed to maximize light emitting efficiency and/or thermal dissipation. Other improvements include an embedded zener diode to protect against harmful reverse bias voltages.

15 Claims, 22 Drawing Sheets

LUMINOUS DEVICES, PACKAGES AND SYSTEMS CONTAINING THE SAME, AND FABRICATING METHODS THEREOF

RELATED APPLICATION

This application is a divisional application of U.S. patent application Ser. No. 12/386,882, filed on Apr. 24, 2009, which claims the benefit of Korean Patent Application No. 2008-0038970 filed on Apr. 25, 2008, the disclosure of which is incorporated herein by reference in its entirety.

FIELD OF THE INVENTION

The present invention relates to luminous devices, packages and systems containing the luminous devices, and methods of fabricating the luminous devices and packages containing it. More particularly, the present invention relates to light emitting devices, such as light emitting diodes and semiconductor lasers.

BACKGROUND OF THE INVENTION

Luminous devices, such as light emitting diodes and semiconductor lasers, have a variety of uses. In particular, light emitting diodes ("LEDs") have garnered significant interest as a result of certain benefits over incandescent light bulbs and fluorescent lights. These benefits include increased longevity and lower electricity requirements. For example, many LCD screens utilize LED's. In addition to light uses, LEDs can also be used for sterilization and disinfection. Similarly, semiconductor lasers, such as laser diodes, have also garnered significant interest, since they can be used in a variety of applications. For example, semiconductor lasers can be used in laser printers, CD/DVD players and optical computing.

SUMMARY OF THE INVENTION

The present invention is directed to luminous devices having a conductive substrate. These luminous devices can be capable of (i) emitting light primarily towards at least one predetermined direction, (ii) increasing the emission of reflected light, or (iii) thermally conducting heat away from the luminous device, or any combination thereof.

One embodiment of the present invention is directed to a first general method of manufacturing a luminous device. The method includes: forming at least one luminous structure on a first substrate; forming a patterned insulation layer on the luminous structure, wherein the insulation layer includes a recess exposing a portion of the second cladding layer; forming a first electrode layer in the recess and on at least a portion of the insulation layer; attaching at least a portion of a surface of the first electrode layer to a second conductive substrate; removing the first substrate to expose at least one surface of the first cladding layer; and forming a second electrode on an exposed surface of the first cladding layer of the luminous structure. The luminous structure includes a first cladding layer, at least a portion of which is on the first substrate, an active layer on the first cladding layer, a second cladding layer on the active layer, and at least one inclined side surface comprising the exposed sides of the first cladding layer, the active layer and the second cladding layer. The method can further include separating the second substrate and regions around the luminous structure to form at least one luminous device comprising at least one luminous structure.

In another embodiment, the first general method can further include the step of forming at least one groove separating at least the second cladding layer and the active layer while providing at least a continuous portion of the first cladding layer, wherein one portion of the groove defines a major portion of the luminous structure and another portion of the groove defines a minor portion of the luminous structure. In this embodiment, (i) the recess in the insulation layer can be formed on the major portion of the luminous structure and (ii) the forming a second electrode step can be modified to include forming a second electrode on the exposed surface of the first cladding layer of the minor portion. More than one straight groove and/or one or more curved grooves can be formed in the luminous structure to provide an island-type minor portion of the luminous structure.

In another embodiment, the first general method can further include the step of forming a convex structure from the first cladding layer, and the second electrode can then be formed on the convex structure. This additional step can be applied to any of the embodiments described herein. For example, this additional step can be applied to the grooved embodiment described in the previous paragraph by forming a convex structure from the first cladding layer of the major portion of the luminous structure.

In another embodiment, the first general method (and any of the previously described embodiments) can be modified by utilizing a second conductive substrate including a zener diode comprising a doped region of the conductive substrate, wherein the doped region has a conductive type opposite to the conductive type of the second conductive substrate, and wherein only the doped region is in electrical communication with the first electrode.

Another embodiment of the present invention is directed to a second general method of manufacturing a luminous device having a through via. This method includes: forming at least one luminous structure on a first substrate, the luminous structure comprising a first cladding layer on the first substrate, an active layer on the first cladding layer, a second cladding layer on the active layer, at least one side surface comprising the exposed sides of the layers, and at least one groove separating at least the second cladding layer and the active layer while provide at least a continuous portion of the first cladding layer, wherein one portion of the groove defines a major portion of the luminous structure and another portion of the groove defines a minor portion of the luminous structure; forming a patterned insulation layer on the luminous structure, wherein the insulation layer includes a recess to expose a portion of the second cladding layer in the major portion of the luminous structure; forming a patterned first electrode layer in the recess and on at least a portion of the insulation layer, wherein the first electrode layer is discontinuous in the groove region to electrically isolate the minor portion from the major portion; forming an insulated through via contact extending from the first electrode layer to the first cladding layer of the minor portion of the luminous structure; attaching at least a portion of a surface of the first electrode layer to a second conductive substrate, wherein the second conductive substrate comprises a patterned conductive intermediate layer having a first portion for attachment to the surface of the first electrode layer corresponding to the recess and a second portion for electrical communication with the through via contact; removing the first substrate to expose at least one surface of the first cladding layer; and separating the second substrate and regions around the luminous structure to form at least one luminous device comprising at least one luminous structure.

In another embodiment, the second general method can be modified so that the second conductive substrate comprises (i) a zener diode having first doped region and (ii) a second doped region extending through the second conductive substrate, wherein the first portion of the patterned conductive intermediate layer is disposed on the first doped region of the second conductive substrate and attached to at least a portion of the surface of the first electrode layer corresponding to the recess, and wherein the second portion of the patterned conductive intermediate layer is disposed on and within the second doped region of the conductive substrate and contacting the through via contact of the minor portion of the luminous structure.

In another embodiment, the second general method can be modified so that the second conductive substrate comprises (i) a zener diode having a first doped region, a (ii) an insulated through via contact extending through the second conductive substrate, wherein the first portion of the patterned conductive intermediate layer is disposed on and within the first doped region of the conductive substrate and attached to at least a portion of the surface of the first electrode layer corresponding to the recess, and wherein the second portion of the patterned conductive intermediate layer is disposed on the through via contact of the conductive substrate and contacting the through via contact of the minor portion of the luminous structure.

The present invention is also directed to luminous devices obtained from any of the methods described above or a combination any steps thereof.

Another embodiment of the present invention is directed to a first general luminous device. This luminous device includes: a luminous structure having a light emitting first surface, a second surface, at least one side surface inclined at an angle compared to the second surface, an active layer having a first surface and a second surface, a first cladding layer on the first surface of the active layer and also providing the first surface of the luminous structure, and a second cladding layer on the second surface of the active layer and also providing the second surface of the luminous structure; an insulation layer on at least a portion of the at least one side surface and the second surface of the luminous structure, wherein the insulating layer includes a recess exposing at least a portion of the second cladding layer; first and second electrodes connected to the luminous structure, wherein the first electrode is in electrical communication with the second cladding layer and disposed on at least a substantial portion of the insulation layer; and a conductive substrate attached to at least a portion of a surface of the first electrode.

In another embodiment, the first general device can further include a groove along the second surface of the luminous structure to provide a major portion of the luminous structure and a minor portion of the luminous structure, wherein the groove separates at least the second cladding layer and the active layer of the luminous structure while provide at least a continuous portion of the first cladding layer, and wherein the second electrode is located on a first surface of the minor portion of the luminous structure. More than one straight groove and/or one or more curved grooves can be formed in the luminous structure to provide an island-type minor portion of the luminous structure.

In another embodiment, the first general device can include a first cladding layer having a convex-shaped lens portion. This additional structural limitation can be included in any of the embodiments described herein. For example, the major portion of the grooved device can include a portion of the first cladding layer having a convex shape.

In another embodiment, any of the previously described embodiments can have a conductive substrate further comprising a zener diode. The zener diode can include a doped region of the conductive substrate, wherein only the doped region is in electrical communication with the first electrode.

Another embodiment of the present invention is directed to a second general luminous device. This device includes: a luminous structure having a light-emitting first surface, at least one side surface, and a second surface; a patterned insulation layer on the second surface and at least a portion of the at least one side surface of the luminous structure, wherein the insulation layer includes a recess exposing a portion of the second surface; a substrate supporting the luminous structure; a first electrical conduit for connection to a power source; a second electrical conduit for connection to the power source; a means for electrically connecting the first surface of the luminous structure with the first electrical conduit; and a means for electrically connecting the second surface of the luminous structure with the first electrical conduit and for reflecting light impinging on the at least one side surface of the luminous structure. The means for reflecting light can also function to conduct heat away from the luminous structure.

Another embodiment of the present invention is directed to a third general luminous device. This device includes: a luminous structure having a light-emitting first surface, a second surface, at least one side surface inclined at an angle compared to the second surface, an active layer having a first surface and a second surface, a first cladding layer on the first surface of the active layer and providing the first surface of the luminous structure, a second cladding layer on a second surface of the active layer and providing the second surface of the luminous structure, and at least one groove separating at least the second cladding layer and the active layer while provide at least a continuous portion of the first cladding layer, wherein one portion of the groove defines a major portion of the luminous structure and another portion of the groove defines a minor portion of the luminous structure; an insulation layer on at least a portion of the at least one side surface and the second surface of the luminous structure, wherein the insulating layer includes a recess exposing at least a portion of the second cladding layer of the major portion of the luminous structure; a patterned first electrode layer in the recess and on at least a portion of the insulation layer, wherein the first electrode layer is discontinuous in the groove region; an insulated through via contact extending from the first electrode layer to the first cladding layer of the minor portion of the luminous structure; a conductive substrate attached to the first electrode, wherein the conductive substrate comprises a patterned conductive intermediate layer having a first portion for attachment to the surface of the first electrode layer corresponding to the recess, and a second portion for electrical communication with the through via contact.

In another embodiment, the third general luminous device can include a conductive substrate comprising (i) a zener diode having first doped region and (ii) a second doped region extending through the second conductive substrate, wherein the first portion of the patterned conductive intermediate layer is disposed on and within the first doped region of the conductive substrate and attached to at least a portion of the surface of the first electrode layer corresponding to the recess, and wherein the second portion of the patterned conductive intermediate layer is disposed on the second doped region of the conductive substrate and contacting the through via contact of the minor portion of the luminous structure.

In still another embodiment, the third general luminous device can include a conductive substrate comprising (i) a zener diode having a first doped region, a (ii) an insulated through via contact extending through the second conductive substrate, wherein the first portion of the patterned conductive intermediate layer is disposed on the first doped region of the conductive substrate and attached to at least a portion of the surface of the first electrode layer corresponding to the recess, and wherein the second portion of the patterned conductive intermediate layer is disposed on the through via contact of the conductive substrate and contacting the through via contact of the minor portion of the luminous structure.

Another embodiment of the present invention is directed to a first general luminous package including any of the previously described luminous devices. In this embodiment, the luminous package includes: a submount comprising a first conductive region and a second conductive region; a luminous device disposed on the first conductive region of the submount, the luminous device comprising, a luminous structure having a light emitting first surface, a second surface, at least one side surface inclined at an angle compared to the second surface, an active layer having a first surface and a second surface, a first cladding layer on the first surface of the active layer and providing the first surface of the luminous structure, and a second cladding layer on the second surface of the active layer and providing the second surface of the luminous structure; an insulation layer on at least a portion of the at least one side surface and the second surface of the luminous structure, wherein the insulating layer includes a recess exposing at least a portion of the second cladding layer; first and second electrodes connected to the luminous structure, wherein the first electrode is in the recess and on at least a majority of the insulation layer; and a conductive substrate attached to at least a portion of a surface of the first electrode and the first conductive region of the submount; a first wire connecting the second electrode of the luminous device and the second conductive region of the submount. Any of the previously described luminous devices (and their variations) can be used in the first general package claim.

In another embodiment, the first general luminous package includes a submount further having a third conductive region, a fourth conductive region, at least one first through via connecting the connecting the first conductive region and the third conductive region, and at least one second through via connect the second conductive region and the fourth conductive region.

In another embodiment, the first general luminous package (including all of the previously described embodiments of luminous devices) can include a luminous device having a conductive substrate with a zener diode comprising an undoped region and a doped region of the conductive substrate, wherein the doped region has a conductive type opposite to the conductive type of the second conductive substrate, and wherein only the doped region is in electrical communication with the first electrode; wherein the second conductive substrate further comprises a patterned conductive intermediate layer including a first portion formed on and within the doped region of the conductive substrate, and wherein at least a portion of the surface of the first electrode layer is bound to the first portion of the conductive intermediate layer to provide electrical communication between the first electrode layer and the first portion of the intermediate layer; and wherein the first wire electrically connects the second electrode of the luminous device to the first conductive region of the submount, and a second wire electrically connects the conductive intermediate layer with the second conductive region of the submount.

Another embodiment of the present invention is directed to a second general luminous package including a luminous device. In this embodiment, the luminous package includes: a submount comprising a first conductive region and a second conductive region; a luminous device disposed on the first conductive region of the submount, the luminous device comprising, a luminous structure having a first surface, at least one side surface, and a second surface, wherein the at least one side is inclined at an angle compared to the second surface, the luminous structure comprising an active layer having a first side surface and a second side surface, a first cladding layer on the first side surface of the active layer and providing the first surface of the luminous structure, and a second cladding layer on a second side surface of the active layer and providing the second surface of the luminous structure, and at least one groove separating at least the second cladding layer and the active layer while provide at least a continuous portion of the first cladding layer, wherein one portion of the groove defines a major portion of the luminous structure and another portion of the groove defines a minor portion of the luminous structure, an insulation layer formed on at least a portion of the at least one side surface and the second surface of the luminous structure, wherein the insulating layer includes a recess to expose at least a portion of the second cladding layer, a patterned first electrode layer formed in the recess and on at least a portion of the insulation layer, wherein the first electrode layer is discontinuous in the groove region, a through via contact extending from the first electrode layer to the first cladding layer of the minor portion of the luminous structure, and a conductive substrate attached to at least a portion of a surface of the first electrode, the conductive substrate comprising a patterned conductive intermediate layer and a first doped region, wherein the patterned conductive intermediate layer has a first portion positioned to be attached to at least a portion of the surface of the first electrode layer corresponding to the recess, and a second portion positioned to be in electrical communication with the through via contact of the minor portion of the luminous structure, and wherein the first doped region has a conductive type opposite to the conductive type of the second conductive substrate, and is position to be in electrical communication with the through via contact of the minor portion of the luminous structure and first conductive region of the submount; and a wire electrically connecting the first portion of the conductive intermediate layer to the second conductive region of the submount.

In another embodiment, the second general luminous package includes a luminous device having a the second conductive substrate including a through via contact instead of the first doped region, wherein the through via contact extends through the second conductive substrate, and is positioned to be in electrical communication with the first portion of the patterned conductive intermediate layer, the through via contact of the minor portion of the luminous structure, and the first conductive region of the submount.

In another embodiment, any of the packages described herein can further include an encapsulant covering the luminous device, or at least one phosphor, or a combination thereof.

Another embodiment of the present invention is directed to luminous systems including any of the luminous packages described herein. These packages can also be formed into arrays.

BRIEF DESCRIPTION OF THE DRAWINGS

The above and other advantages of the present invention will become readily apparent by reference to the following detailed description when considered in conjunction with the accompanying drawings in which.

DESCRIPTION OF THE EMBODIMENTS

Figure 1A:
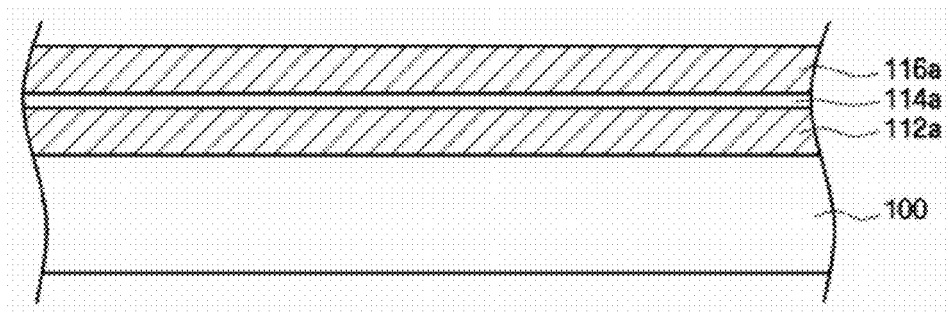
FIGS. 1A-1H illustrate one embodiment of a method for fabricating a luminous device.

Embodiments of the present invention will be described with reference to the accompanying drawings. The present invention may, however, be embodied in many different forms and should not be construed as limited to the embodiments set forth herein. Rather, the embodiments are provided so that disclosure of the present invention will be thorough and complete, and will fully convey the scope of the present invention to those skilled in the art. The principles and features of this invention may be employed in varied and numerous embodiments without departing from the scope of the present invention. In the drawings, the relative sizes of layers and regions may be exaggerated for clarity. The drawings are not to scale. Unless otherwise indicated, like reference numerals designate like elements throughout the drawings.

As used herein, the phrase "patterning process" or "patterned element" (where the "element" can be a particular layer, region, or element) means forming a predetermined pattern of the layer, region or element. Such a predetermined pattern can be obtained, for example, by using any combination of the following steps: at least one deposition step; at least one photomasking step; at least one etching step; and/or at least one photomask removing step. Two examples of a patterning process include the following combination of steps: (i) a deposition step, then a photomasking step, then an etching step, and then a photomask removing step; or (ii) a photomasking step, then a deposition step, and then a photomask removing step. In another example, the phrase "deposition and patterning" means a patterning process including at least a deposition step, a photomasking step, an etching step, and a photomask removing step. Multiple masking, deposition, and/or etching steps can be used to obtain the desired pattern of the particular layer, region, or element. Nonlimiting examples of deposition methods include PVD, CVD (including ALD), plating (e.g., electroplating and electroless plating), and coating (e.g., spin coating and spray coating).

As used herein, the term "luminous" means light emitting. For example, the phrase luminous device means a light emitting device. Nonlimiting examples of luminous devices include a light emitting diode ("LED") and a laser. Although all of the embodiments herein are described in view of an LED, all of the embodiments can be converted to a laser, e.g., an LED having a reflective first electrode and a semi-transparent mirror layer (also known as an output coupler) to the light emitting surface.

As used herein, when an element or layer is referred to as being "on," "connected to" and/or "coupled to" another element or layer, the element or layer may be directly on, connected and/or coupled to the other element or layer or intervening elements or layers may be present. In contrast, when an element is referred to as being "directly on," "directly connected to" and/or "directly coupled to" another element or layer, no intervening elements or layers are present. As used herein, the term "and/or" may include any and all combinations of one or more of the associated listed items.

Furthermore, although the terms first, second, etc. may be used herein to describe various elements, components, regions, layers and/or sections, these elements, components, regions, layers and/or sections should not be limited by these terms. These terms may be used to distinguish one element, component, region, layer and/or section from another element, component, region, layer and/or section. For example, a first element, component, region, layer and/or section discussed below could be termed a second element, component, region, layer and/or section without departing from the teachings of the present invention.

Spatially relative terms, such as "beneath," "below," "lower," "above," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as "below" and/or "beneath" other elements or features would then be oriented "above" the other elements or features. The device may be otherwise oriented (e.g., rotated 90 degrees or at other orientations) and the spatially relative descriptors used herein interpreted accordingly.

The terminology used herein is for the purpose of describing particular embodiments only and is not intended to limit the invention. As used herein, the singular terms "a," "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof.

Unless otherwise defined, all terms (including technical and scientific terms) used herein may have the same meaning as what is commonly understood by one of ordinary skill in the art. It will be further understood that terms, such as those defined in commonly used dictionaries, should be interpreted as having a meaning that is consistent with their meaning in the context of this specification and the relevant art and will not be interpreted in an idealized and/or overly formal sense unless expressly so defined herein.

Embodiments of the present invention are described with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated as a rectangle will, typically, have rounded or curved features. Thus, the regions illustrated in the figures are schematic in nature of a device and are not intended to limit the scope of the present invention.

The embodiments provided hereinafter generally provide luminous devices having a conductive substrate. These luminous devices can be capable of (i) emitting light primarily towards at least one predetermined direction, or (ii) substantially increasing the emission of reflected light, (iii) thermally conducting heat away from the luminous device, or any combination thereof.

One embodiment of the present invention is directed to a method of manufacturing a vertical-type luminous device using high throughput processes. FIGS. 1A-1H are cross-sectional views illustrating the method for a single luminous device. As is well understood by the skilled artisan, a plurality of luminous devices can be manufactured together on a single substrate, and multiple substrates can be manufactured at one time, as illustrated in FIG. 2.

Figure 2A:
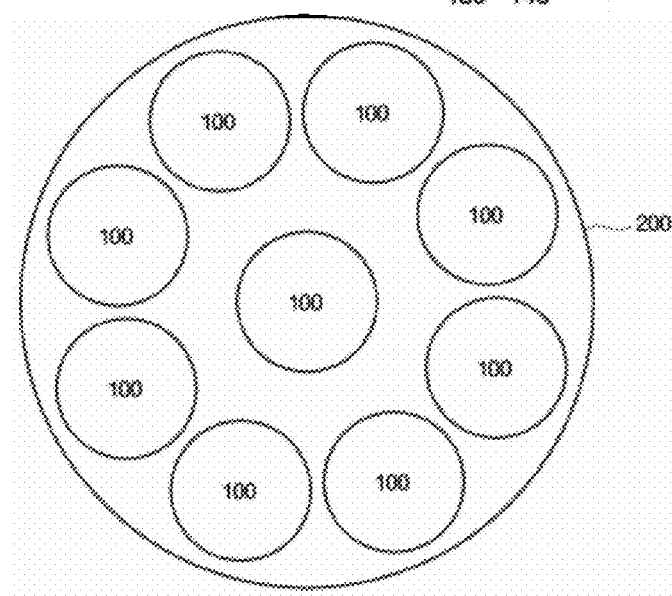
FIG. 2A illustrates one method of processing a plurality of first substrates.

The method can utilize a pre-formed, multilayered, light-emitting heterostructure, as illustrated in FIG. 1A. The pre-formed heterostructure can be obtained according to desired specifications or manufactured. Examples of useful manufacturing processes for the heterostructures can be found in U.S. Pat. No. 5,777,350 issued to Nakmura et al. and titled "Nitride Semiconductor Light-Emitting Device," U.S. Pat. No. 6,040,588 issued to Koide et al. and titled "Semiconductor Light-Emitting Device," U.S. Pat. No. 5,959,307 issued to Nakamura et al. and titled "Nitride Semiconductor Device," U.S. Pat. No. 5,753,939 issued to Sassa et al. and titled "Light-Emitting Semiconductor Device Using a Group III Nitride Compound and Having a Contact Layer Upon Which an Electrode is Formed," U.S. Pat. No. 6,172,382 issued to Nagahama et al. and titled "Nitride Semiconductor Light-Emitting and Light-Receiving Devices," and U.S. Pat. No. 7,112,456 issued to Park et al. and titled "Vertical GAN Light Emitting Diode and Method for Manufacturing the Same," each of which patents are incorporated herein by reference in their entirety. The preformed heterostructure typically includes at least a first substrate 100, a first cladding layer 112a, an active layer 114a, and a second cladding layer 116a.

The first substrate 100 is typically a dielectric or a semiconductor. Examples of useful materials for the first substrate 100 include, but are not limited to, sapphire ($Al_2O_3$), ZnO, Si, SiC, GaAs, GaP, mixtures thereof, and alloys thereof. It is preferred to utilize a substrate that is a good lattice match with the first cladding layer 112a.

Figure 2B:
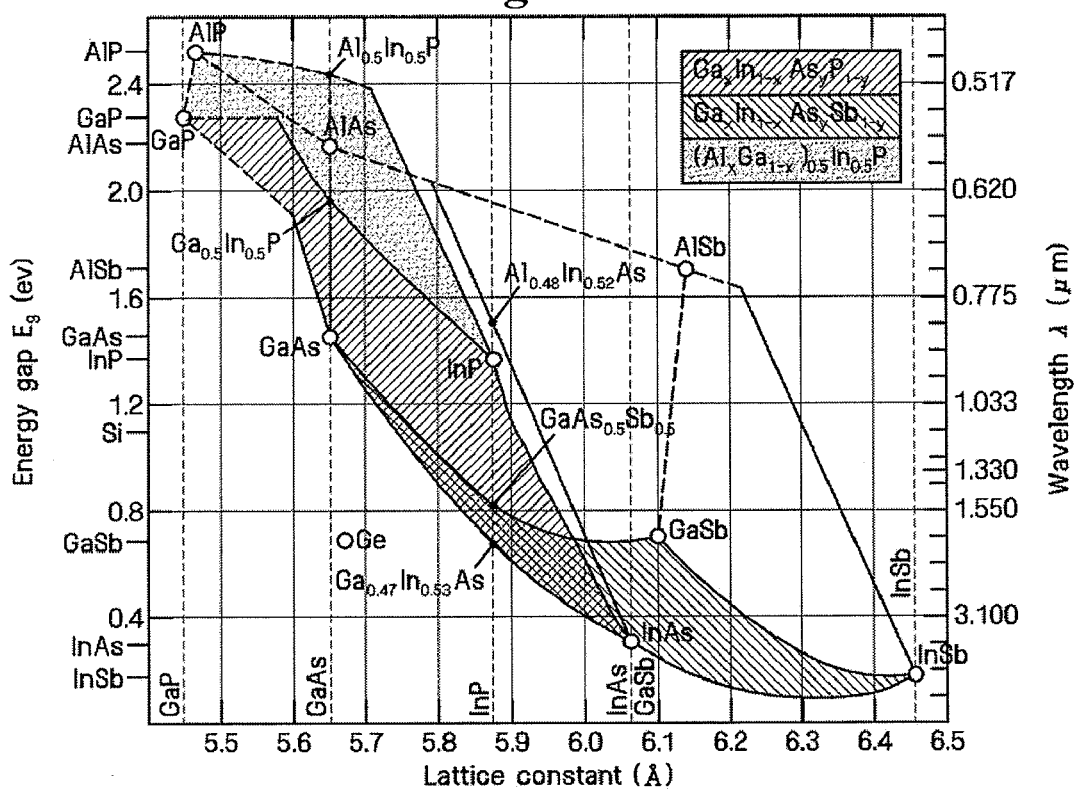
FIG. 2B illustrates certain attributes of various materials useful in forming the p-n junction of LEDs.

The first cladding layer 112a, the second cladding layer 116a, and the active layer 114a typically include a form of GaN or InGaN, which can be expressed by the chemical formula $In_xAl_yGa_{(1-x-y)}N$, where $0 \leq x \leq 1$ and $0 \leq y \leq 1$. Accordingly, useful materials include, but are not limited to, AlGaN and InGaN. Other useful materials are illustrated in FIG. 2B. The cladding layers and the active layer can also be doped with various materials. For example, the first cladding layer 112a can be a Si doped n-type InGaN and the second cladding layer 116a can be a Mg doped p-type InGaN. Furthermore, the first cladding layer 112a and the second cladding layer 116a typically have opposite conductive types, and the conductivity types of the layers can be switched. For example, if the first cladding layer is n-type, the second cladding layer is p-type, and vice versa. For purposes of this embodiment, the first cladding layer 112a will be designated as n-type and the second cladding layer 116a will be designated as p-type.

The active layer 114a produces light by recombining an electron and a hole in a p-n junction. The frequency (or wavelength) of light emitted, and, therefore, its color, depends on the band gap energy of the materials forming the p-n junction and can be infrared, visible, or ultraviolet. The active layer includes at least one potential well and potential barrier, which form a Single Quantum Well. The active layer can also include a plurality of quantum wells to provide a Multiple Quantum Well. Light emitting characteristics can be adjusted by doping the potential barrier with a compound selected from the group consisting of B, Al, P, Si, Mg, Zn, Mn, Se, or a combination thereof. Preferred doping materials include Al, Si, or a combination thereof.

The first cladding layer 112a, the active layer 114a, and the second cladding layer 116a can be sequentially formed on the first substrate 100 by any process known to the skilled artisan. For example, these layers can be formed on the substrate by MOCVD (metal organic chemical vapor deposition), liquid phase epitaxial growth, hydride vapor phase epitaxial growth, molecular beam epitaxial growth and/or metal organic vapor phase epitaxial growth. Thereafter, a heat treatment process can be performed to activate the p-type cladding layer. Typical heat treatment temperatures are at about 400° C. to about 800° C. For example, if the second cladding layer 116a is $In_xAl_yGa_{(1-x-y)}N$ doped with Mg, it is believed that the hydrogen associated with the Mg can be removed to provide better p-type characteristics. The resulting heterojunction (e.g., the p-n junctions regions formed by the first and second cladding layers in or near the active layer) provides for high injection efficiency at room temperature.

Figure 1B:
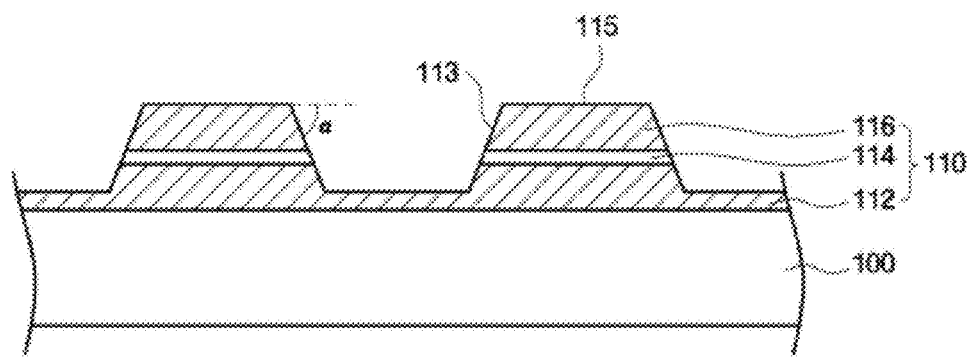

The multilayered, light-emitting hetero structure, illustrated in FIG. 1A, is subjected to a patterning process to form a luminous structure 110 having at least on side wall 113 and a top surface 115, as illustrated in FIG. 1B. The patterning process can include one or more masking and etching steps. It is preferable to pattern the luminous structure to have a shape which increases light emitting efficiency, e.g., by improving (i) internal reflections of photons, (ii) the escape angle/path of the photons after reflectance, or (iii) both. For example, at least one side wall surface 113 of the luminous structure illustrated in FIG. 1B is angled to improve light reflectance and emission. In particular, it is preferred to form an angle $\alpha$ between an imaginary line coinciding with the top surface 115 and the side wall surface 113, as illustrated in FIG. 1B, such that the surface area of the top surface 115 is less than the surface area of the active layer 114. The angle α is preferably greater than about 30° but less than or equal to 90°, and more preferably between about 40° to about 70°. The angle α can be constant or vary continuously to form either partially or wholly concave or convex sidewall shapes. Further nonlimiting examples of patterned shapes for the luminous structure 110 include an inverted parabola, an inverted truncated parabola, a frustum of a cone (i.e., truncated cone), a frustum of a pyramid (i.e., truncated pyramid), and a combination thereof.

Figure 1C:
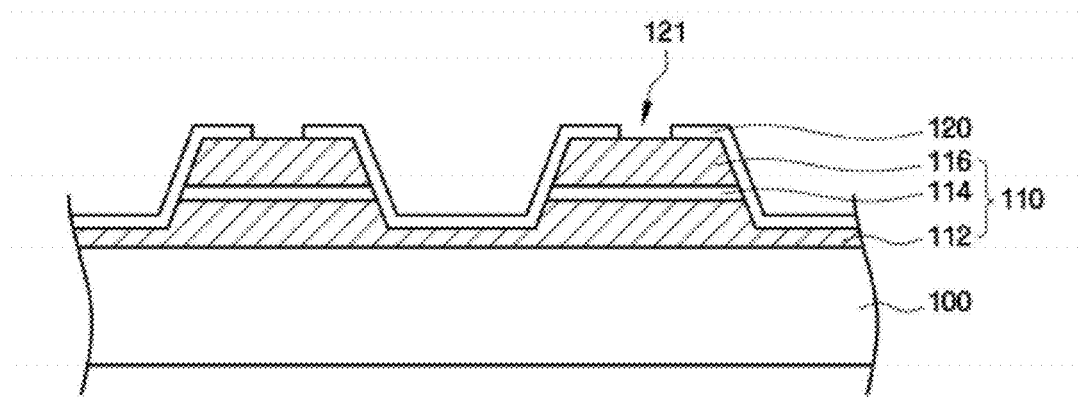

After forming the luminous structure, an insulating layer 120 (e.g., to provide electrical insulation) is formed on the luminous structure 110, as illustrated in FIG. 1C. The insulating layer 120 can be conformally formed on the luminous structure 110 so as to prevent electrical shorts between the p-type and n-type regions via the first electrode 140, described hereinafter. The insulating layer 120 is also believed to provide additional structural support for the luminous structure 110. Insulating layer 120 is also preferably thermally conductive (e.g., by choice of materials or by utilizing a very thin layer) so that heat can be transferred to the first electrode layer 140 and away from the luminous structure 110. The insulating layer is also preferably transparent, e.g., translucent enough to allow light to pass through it and be reflected by the later formed first electrode, described hereinafter. The transparency of the material used in the insulating layer will also depend on the thickness of the layer, e.g., a thinner layer will be more transparent, and the wavelength of the emitted light. Accordingly, the thickness of the insulating layer 120 is preferably from about 10 Å to about 1 um, and more preferably from about 1000 Å to about 3000 Å, and wherein the thickness can be constant or vary depending on manufacturing processes and variations therein. It should be noted that step coverage of the inclined sidewall surface 113. Useful materials for the insulating layer include, but are not limited to, $SiO_2$, $SiN_x$, ZnO, $Al_2O_3$, AlN, and combination thereof.

The insulating layer 120 can be formed by any method known in the art. In one example, the insulating layer 120 can be formed in a two step process. The first insulating layer, such as $SiO_2$, can be utilized to as a gap filler. Then a second insulating layer having a higher etch selectivity than the first insulating layer can be formed on the first insulating layer. Thereafter, a patterning and etch process can be utilized to form a desired thickness and shape of the insulating layer 120.

Alternatively, the insulating layer 120 can be formed in any manner to prevent electrical shorts between the p-type and n-type regions via the first electrode 140, discussed hereinafter. For example, in an alternative embodiment, the insulating layer 120 can be formed to cover only the first cladding layer 112 and the exposed side surfaces of active layer 114, e.g., by forming a patterned insulating layer. In still another alternative embodiment, the insulating layer 120 can be formed to cover only the portions on which the later formed first electrode will be formed. For example, a patterned insulating layer 120 can be formed only on the second cladding layer 116 and the exposed side surfaces of the active layer 114, when a patterned first electrode 140 is formed on the patterned insulating layer. In still another alternative, the process step of forming the insulating layer can be skipped, if a patterned first electrode 140 (described hereinafter) is formed only on the second cladding layer 115. In this embodiment, electrical shorts are prevented because the first electrode 140 does not contact either the active layer 114 or the first cladding layer. In this embodiment, the patterned first electrode 140 can be formed utilizing a photomask on the formed luminous structure 110 and then plating the first electrode 140.

The insulation layer is formed to include at least one recess 121, e.g., by a patterning process, to expose a portion of the surface of the second cladding layer 116, thereby allowing electrical communication between the second cladding layer 116 and the later formed first electrode 140, described hereinafter. Although FIG. 1C only illustrates one recess 121, more than one recess can be formed, and the recess can have a variety of geometric shapes, e.g., a ring. Lastly, the recess 121 can be formed anywhere along the top surface 115 of luminous structure 110, along the one or more sidewall surfaces 113 of the luminous structure 110 down to the active layer 114, or any combination thereof. Increasing the available surface area for electrical communication between the second cladding layer 116 and the later formed first electrode 140 can be beneficial.

The insulating layer is preferably transparent, e.g., translucent enough to allow light to pass through it and be reflected by the later formed first electrode, described hereinafter. The transparency of the material used in the insulating layer will depend on the thickness of the layer, e.g., a thinner layer will be more transparent, and the wavelength of the emitted light. Useful materials for the insulating layer include, but are not limited to $SiO_2$, $SiN_x$, ZnO, $Al_2O_3$, AlN, and combination thereof.

Figure 1D:
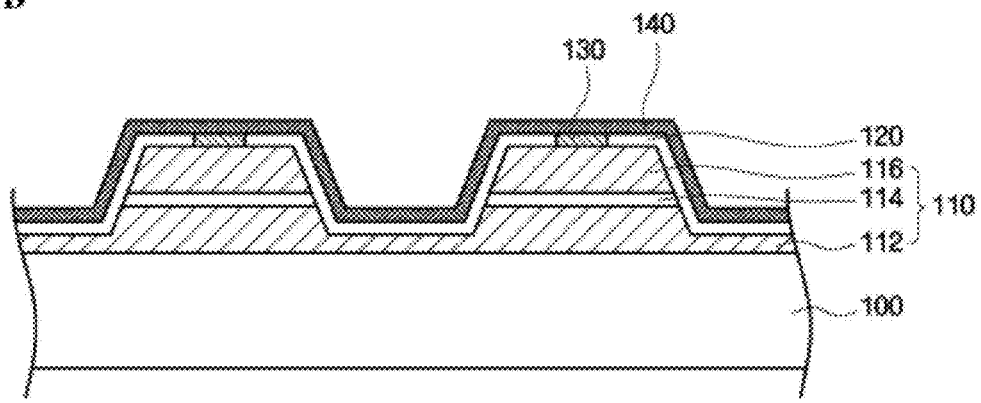

After forming the insulating layer, a first electrode layer 140 is formed over the insulating layer 120 and in the recess 121 of the insulating layer, as partially illustrated in FIG. 1D. It is believed that, since the first electrode layer 140 can be in thermal communication with the second cladding layer surface 115 and at least a portion of at least one side wall surface 113 of the luminous structure 110, the first electrode layer 140 can provide improved conduction of heat away from the luminous structure.

Alternatively, when the insulating layer 120 is formed in a manner to prevent electrical shorts between the p-type and n-type regions via the first electrode 140, the first electrode layer 140 can be formed on the exposed portions of the second cladding layer 116 of the luminous structure 110 and optionally also on any portion of the insulating layer 120. For example, when a patterned insulating layer 120 is formed over only the first cladding layer 112 and the exposed side surfaces of active layer 114, the first electrode 140 can be formed on the second cladding layer 115 and optionally on any portion of the insulating layer 120. Similarly, when a patterned insulating layer is formed only on the second cladding layer 116 and the exposed side surfaces of the active layer 114, then a patterned first electrode 140 is formed on the patterned insulating layer 120, e.g., the first electrode is not formed on the first cladding layer 112. These alternative embodiments also improve heat conduction, since the first electrode 140 is in thermal communication with at least the second cladding layer surface 115 and at least a portion of the at least one side surface 113 of the luminous structure 110.

The first electrode layer 140 can be any electrically conductive material. Nonlimiting examples of useful materials include ITO (Indium-Tin-Oxide), Cu, Ni, Cr, Ag, Al, Au, Ti, Pt, V, W, Mo, mixtures thereof, and alloys thereof. It is preferred, however, to utilize a reflective material for the first electrode layer 140 in order to reflect light through the insulation layer 120 and substantially increase the light emitting efficiency. Examples of useful reflective materials include, but are not limited to Ag, Al, Pt or alloys thereof to increase the light emitting efficiency. Accordingly, the continuous first electrode layer 140 can serve either or both of the following two additional functions: (1) an electrical contact and (ii) a reflector of light.

In an alternative embodiment, an ohmic layer 130 can be formed within the recess 121, e.g., by patterned deposition, before forming the first electrode layer 140, as illustrated in FIG. 1D. Useful materials for the ohmic layer 130 include, but are not limited to ITO, ZnO, Ag, Cu, Ti, W, Al, Au, Pt, Ni, $In_2O_3$, $SnO_2$, Zn, mixtures thereof, and alloys thereof. Preferred materials for the ohmic layer include, but are not limited to Zn, Ni, Ag, Ti, W, Pt, ITO, mixtures thereof and alloys thereof. Furthermore, a heat treatment can be performed to activate the ohmic layer. Typically, the heat treatment can be conducted at about 400° C. before forming the first electrode layer.

Although not illustrated, additional layers can be added onto the first electrode layer. For example additional layers can be added to protect the first electrode or provide additional structural strength to luminous structure 110.

Figure 1E:
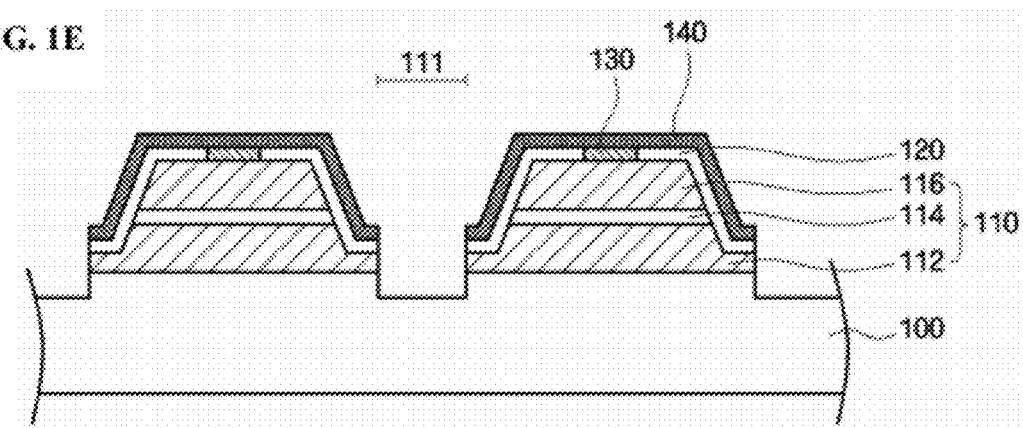

After forming the first electrode layer 140, an optional process step includes patterning (e.g., a combination of a masking and etching steps) the areas 111 separating each luminous structure 110 to provide separated luminous structures 110, as illustrated in FIG. 1E. Accordingly, in the areas 111 surrounding the luminous structure 110, the first electrode layer 140, the insulation layer 120, and the first cladding layer 112 are removed to expose the first substrate 100. This patterning step, however, can be omitted or performed at a later time, e.g., after transfer to the second substrate or during separation of the second substrate. If patterning of the areas 111 around the luminous structure 110 is conducted after transfer to the second substrate 200, the patterning will be conducted on the first cladding layer 112, resulting in a local removal of at least the first cladding layer 112. If patterning of the areas around the luminous structure 110 is conducted after transfer to the second substrate 200, it is also preferably to further locally remove the insulating layer 120, and the first electrode layer 140.

Figure 1F:
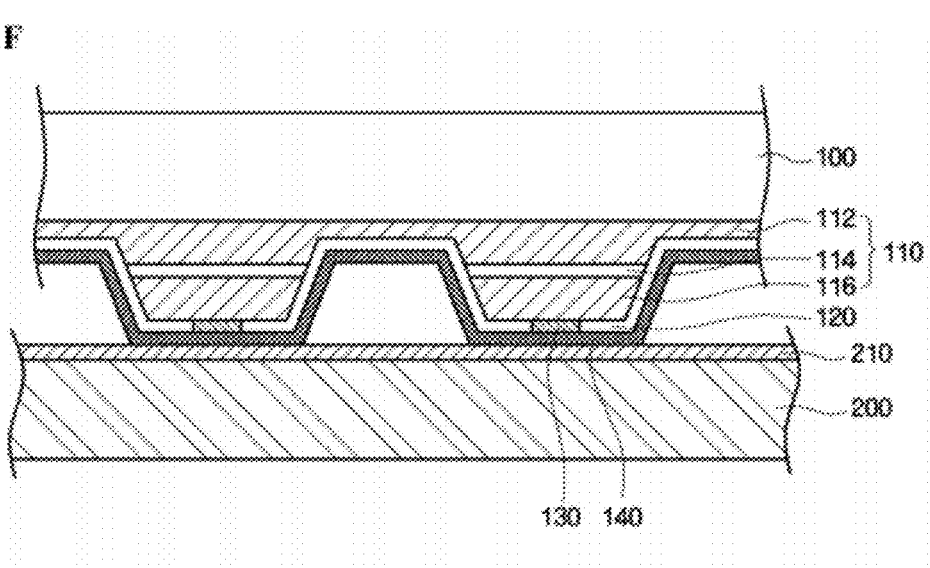

After forming the first electrode layer (assuming the step of patterning the areas around the luminous structure is not conducted), at least a portion of the first electrode layer 140 (e.g., the outermost portions corresponding to the top surface 115 of the luminous structure) is bonded to a second substrate 200, as illustrated in FIG. 1F. Any bonding method known in the art can be utilized. Nonlimiting examples of bonding methods include eutectic bonding (e.g., using Au, Sn, Ag, Pb, mixtures thereof, and alloys thereof), soldering, gold-silicon bonding, and adhesive bonding. Also useful are conductive adhesive layers, as described in U.S. Pat. No. 7,112,456 issued to Park et al. and titled "Vertical GAN Light Emitting Diode and Method for Manufacturing the Same," which is incorporated herein by reference in its entirety.

The second substrate 200 is preferably conductive (typically p-type silicon for an n-type first cladding layer) to allow electrical communication with the second cladding layer 116, e.g., via the first electrode and optionally the ohmic layer. Useful materials for the second substrate include, but are not limited to, Si, strained Si, Si alloy, Si—Al, SOI (silicon on insulator), SiC, SiGe, SiGeC, Ge, Ge alloy, GaAs, InAs, Group III-V semiconductors, Group II-VI semiconductors, combinations thereof, and alloys thereof.

As illustrated in FIG. 1F, the second substrate 200 can also include a patterned conductive intermediate layer 210 to enhance the bond between the second substrate 200 and the first electrode layer 140, e.g., compensate for the warpage in the first substrate and/or the second substrate. The patterned conductive intermediate layer 210 is formed on second substrate 200 before bonding the second substrate 200 to at least a portion of the first electrode layer 140 (e.g., the outermost portions corresponding to the top surface 115 of the luminous structure) to the second substrate 200, as illustrated in FIG. 1F. The conductive intermediate layer 210 is patterned to substantially align and match with the bonding surface (or surfaces) of the first electrode layer 140. The intermediate layer 210 (typically used for eutectic bonding) can have lower reflective characteristics than the first electrode. Useful materials for the intermediate layer 210 include, but are not limited to, Au, Ag, Pt, Ni, Cu, Sn, Al, Pb, Cr, Ti, W, combinations thereof, and alloys thereof. For example, when Au—Sn is used as the intermediate layer 210, bonding can be conducted via a thermal process (e.g., at about 200° C. to about 400° C.) and optionally utilize pressure. Furthermore, the intermediate layer can be a single layer or multiple layers, e.g., each layer having a different material or alloy.

Another optional additional process step is thinning the second conductive substrate 200 to a desired thickness before removing the first substrate 100, because it is difficult to thin the second conductive substrate after removing the first substrate 100. For example, the second conductive substrate can be thinned by a CMP process, a grinding process, an etching process, or any combination thereof.

Figure 1G:
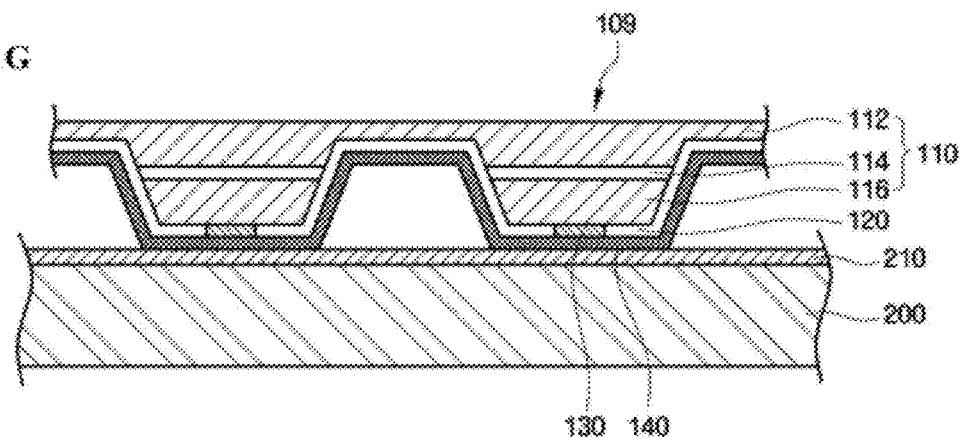

The transfer to the second substrate 200 is completed when the first substrate 100 is removed to expose the first cladding region 112, as illustrated in FIG. 1G The first substrate can be removed using any method know to the skilled artisan. For example, a laser can be utilized to separate the first substrate, as provided in U.S. Pat. No. 7,112,456 issued to Park et al. and titled "Vertical GaN Light Emitting Diode and Method for Manufacturing the Same," which is incorporated herein by reference in its entirety. If a laser is utilized, it is preferable to first thin and/or polish the first substrate 100 (e.g., by CMP, grinding, and/or etching) before utilizing the laser. In another example, the first substrate 100 can be removed using a chemical process, e.g., a chemical lift-off (CLO). An example of an appropriate CLO process is provided in Ha et al., "The Fabrication of Vertical Light-Emitting Diodes Using Chemical Lift-Off Process," *IEEE Photonics Technology Letters*, Vol. 20, No. 3, pp. 175-77 (Feb. 1, 2008), and U.S. Pat. No. 4,846,931 issued to Gmitter and titled "Method for Lifting-Off Epitaxial Films," which are incorporated herein by reference in their entirety.

Figure 1H:
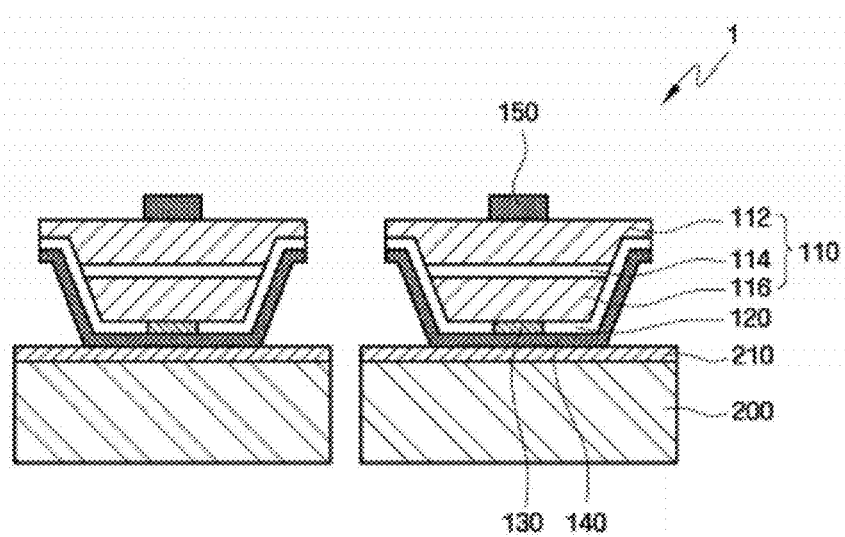

After removing the first substrate, a second electrode 150 is formed on the exposed first cladding region 112, as illustrated in FIG. 1H. Since the second electrode is preferably shaped to minimize interference with light emission, the second electrode 150 typically has a substantially smaller surface area in comparison to the surface area of the first cladding region 112. The second electrode can be formed using any process know to the skilled artisan. For example, the second electrode can be formed using (i) a deposition (e.g., CVD, sputtering, etc. of the second electrode material) and patterning process or (ii) a photo-resist lift off process.

The second electrode 150 can also have various configurations to improve current spreading. For example, the second electrode can be formed (i) near at least one edge of the first cladding region, (ii) in the shape of a frame formed on the edge of the first cladding region, and/or (iii) to include a plurality of smaller electrodes.

Useful materials for the second electrode 150 include, but are not limited to, ITO (Indium-Tin-Oxide), Cu, Ni, Cr, Au, Ti, Pt, Al, V, W, Mo, Ag, mixtures thereof, and alloys thereof. The second electrode 150 can be formed as a single layer or multiple layers, e.g., each layer having a different material or alloy. The second electrode 150 is preferably made of a material that is at least semi-transparent.

In an alternative embodiment, an ohmic layer (not illustrated) can be formed between the surface of the first cladding layer 112 and the second electrode 150. Useful materials for the ohmic layer include, but are not limited to ITO, ZnO, Zn, Ti, Pt, Al, Ni, $In_2O_3$, $SnO_2$, mixtures thereof, and alloys thereof. Preferred materials for the ohmic layer include, but are not limited to ITO, Ti, Pt, Ni, mixtures thereof and alloys thereof. Furthermore, a heat treatment can be performed to activate the ohmic layer. Typically, the heat treatment is conducted at about 400° C. before forming the second electrode 150.

Although not illustrated in FIG. 1H, a conductive layer can also be added to the surface of the first cladding layer in order to improve current spreading, e.g., before attaching the second electrode 150. The hereinbefore described ohmic layer can also serve as the conductive layer. It is preferred to use a transparent conductive layer, such as ITO (Indium-Tin-Oxide).

The exposed surface of the first cladding layer 112 can also be textured (not shown) before attaching the second electrode 150 to increase the light emitting efficiency. Surface texturing can be applied to any of the embodiments described herein. In order to enhance the attachment of the second electrode 150 to the exposed surface of the first cladding layer 112, the area of the first cladding layer 112 (where the electrode 150 attaches) can be free from surface texturing. It is believed that surface texturing reduces the total internal reflection resulting from the difference in refractive index between the first cladding layer and air. Surface texturing can be done by any known process known to the skilled artisan. One example of such a process is the use of a wet etchant, such as KOH.

After the second electrode 150 is formed, the second substrate 200 and the areas around the luminous structure can be separated to form at least one luminous device 1 including at least one luminous structure 110, as illustrated in FIG. 1H. Any process known to the skilled artisan can be used to separate the second substrate 200 and the areas around the luminous structure. Nonlimiting examples of processes for separating the second substrate and the areas around the luminous structure include, but are not limited to, laser sawing, blade sawing, diamond cutting, etching, and combinations thereof.

The hereinbefore described "optional process step" of patterning the areas 111 around the luminous structure (e.g., as described hereinbefore in relation to FIG. 1E) can be conducted before or concurrently with the process step of separating the second substrate into individual luminous devices, as illustrated in FIGS. 1G and 1H. For example, the areas around the luminous structure can be patterned (e.g., a combination of at least one masking and etching step) to locally remove the first cladding layer 112, the insulating layer 120, and the first electrode layer 140. Thereafter, the second substrate can be separated, e.g., by laser sawing.

Another embodiment of the present invention is also directed to a vertical-type luminous device formed on a conductive substrate. Such a luminous device can be manufactured according to the high throughput process described hereinbefore.

Figure 3:
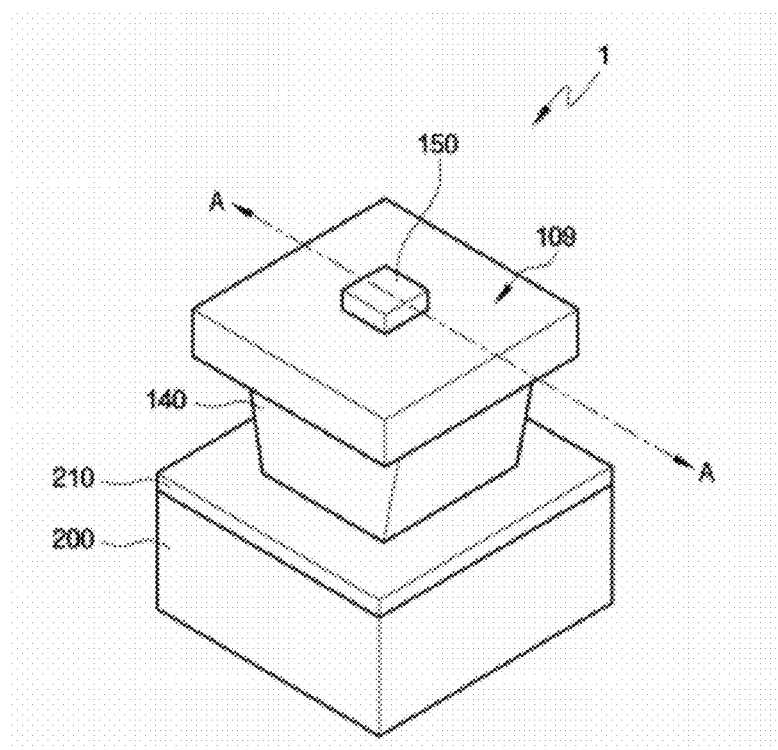
FIGS. 3 and 4 illustrate two embodiments of a luminous device, which can be obtained from the method illustrated by FIGS. 1A-1H.
Figure 4:
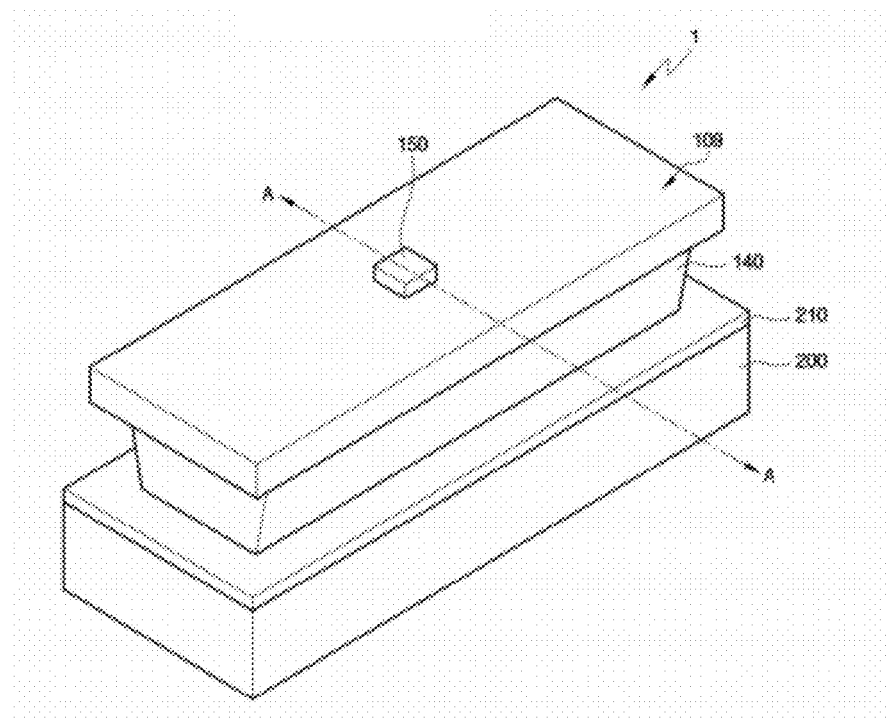
Figure 5:
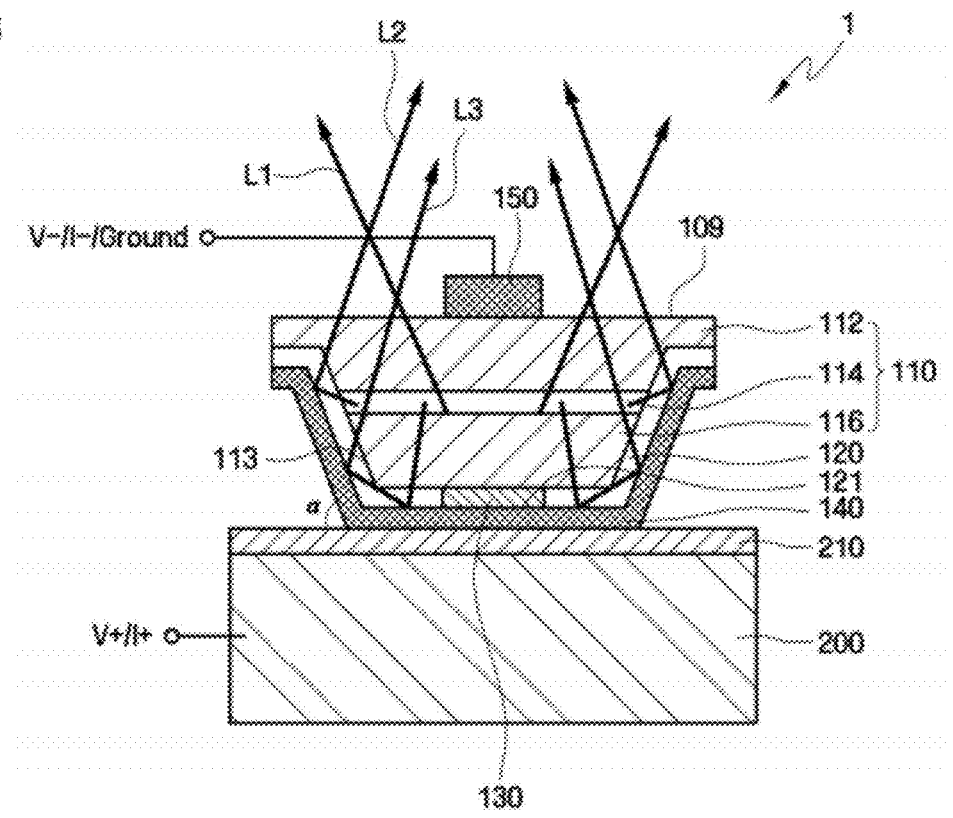
FIG. 5 illustrates a cross-sectional view of the embodiments illustrated in FIGS. 3 and 4.

FIGS. 3-5 illustrates two embodiments of the vertical-type luminous device 1. FIG. 3 illustrates one embodiment having a substantially square-shaped top profile, FIG. 4 illustrates another embodiment having a substantially rectangular-shaped top profile, and FIG. 5 is a cross-sectional illustration of the embodiments illustrated in FIGS. 3 and 4 along axis A-A. Although these embodiments are described in relation to the shape of the top profile or the shape of the luminous structure 110, these references are intended only as a reference to the top profile or the overall shape of the luminous structure 110. Accordingly, the luminous devices described herein are not limited to these shapes and can have any desired overall outer shape.

In the embodiments illustrated in FIGS. 3-5, the vertical-type luminous device 1 includes (i) a multilayered, light-emitting luminous structure 110 having a first surface 109, a second surface 115, and at least one side surface 113, (ii) an insulating layer 120 covering the second surface 115 and at least a portion of the at least one side surface 113 of the luminous structure 110, (iii) first and second electrodes (140, 150 respectively) connected to the luminous structure 110, and (iv) a conductive substrate 200 bound to the first electrode 140. The luminous device 1 can further include an intermediate layer 210 between the first electrode 140 and the conductive substrate 200 in order to enhance the bond, e.g., compensate for the warpage in the conductive substrate 200, and an ohmic region 130 situated to contact the second surface 115 of the luminous structure 110 and the first electrode 140, e.g., the ohmic region can be placed in a recess within the insulating layer 120.

The multilayered, light-emitting luminous structure 110 includes a first cladding layer 112, an active layer 114, and a second cladding layer 116. The luminous structures of this embodiment are preferably shaped to increase light emitting efficiency, e.g., by improving (i) internal reflection of light, (ii) the escape angle/path of the light after reflectance, or (iii) both. For example, at least one side wall surface 113 of the luminous structure illustrated in FIG. 5 can be angled to improve light reflectance. In particular, it is preferred to form an internal angle $\alpha$ between an imaginary line coinciding with the second surface 115 and the side wall surface 113, as illustrated in FIG. 5, such that the top surface area of the first surface 109 is greater than the top surface area of the active layer 114. The angle $\alpha$ is preferably greater than about 30° but less than or equal to 90°, and more preferably between about 40° to about 70°. The angle $\alpha$ can be constant or vary continuously to form either partially or wholly concave or convex sidewall shapes. Further nonlimiting examples of shapes for the luminous structure 110 include a parabola, a truncated parabola, an inverted frustum of a cone (i.e., truncated cone), an inverted frustum of a pyramid (i.e., truncated pyramid), and a combination thereof. For example, FIGS. 3 and 4 respectively illustrate a luminous structure 110 having the shape of an inverted frustum of a pyramid (e.g., having a substantially square base) and a frustum of an elongated pyramid (e.g., having a substantially rectangular base).

Furthermore, the exposed surface of the first cladding layer 112 can be textured (not shown), as hereinbefore described. Surface texturing can also be prevented in selected areas, e.g., in areas where the second electrode 150 attaches to the exposed surface of the first cladding layer 112.

The insulating layer prevents electrical shorts between the p-type and n-type regions via the first electrode 140, described hereinafter. It is believed that the insulating layer also provides additional structural support for the luminous structure 110. Insulating layer 120 is also preferably thermally conductive (e.g., by choice of materials or by utilizing a very thin layer) so that heat can be transferred to the first electrode layer 140 and away from the luminous structure 110. The insulating layer is also preferably transparent, e.g., translucent enough to allow light to pass through it and be reflected by the later formed first electrode, described hereinafter. The transparency of the material used in the insulating layer will also depend on the thickness of the layer, e.g., a thinner layer will be more transparent, and the wavelength of the emitted light. Useful materials for the insulating layer include, but are not limited to $SiO_2$, $SiN_x$, $ZnO$, $Al_2O_3$, $AlN$, and combination thereof.

As illustrated in FIG. 5, the insulating layer 120 can cover second surface 115 and the entire side surface 113 of the luminous structure 110. In another embodiment, the insulating layer 120 can cover the second surface 115 and at least a portion of the at least one side surface 113 of the luminous structure 110, e.g., covers at least the second cladding layer 116 and the active layer 114. In another embodiment, the insulating layer 120 can cover only the first cladding layer 112 and the exposed side surfaces of active layer 114, e.g., by forming a patterned insulating layer 120. In still another alternative, the insulating layer is optional and can be removed if the first electrode 140 only extends up the sides of the second cladding layer 116, e.g., when the first electrode is not in electrical communication with the first cladding layer 112 or the active layer 114.

The insulating layer also includes at least one recess 121 exposing the second cladding layer 116 of the luminous structure 110 to allow electrical communication through the insulating layer. Although not illustrated, one or more recesses 121 can be positioned (i) in an off-centered location along second surface 115, (ii) along second surface 115 of luminous structure 110 and side surface 113 of luminous structure 110 but below active layer 114, (iii) along one or more side surfaces 113 but below the active layer 114, or a combination thereof. These alternative locations for recess 121 can be useful to improve current flow. The insulating layer 120 is preferably transparent, e.g., translucent enough to allow at least some light to pass through it.

The first and second electrodes (140, 150 respectively) are in electrical communication with the luminous structure 110. More specifically, the first electrode 140 is in electrical communication with second cladding layer 116 of the luminous structure 110, and the second electrode 150 is in electrical communication with the first cladding layer 112 of the luminous structure 110.

Accordingly, the first electrode 140 is electrically isolated from the active layer 114 and the first cladding layer 112. Electrical isolation of the first electrode 140 can be obtained by having the first electrode extend along the side surface 113 but not reaching up to the active layer 114 of the heterostructure, e.g., only along second surface 115 or along second surface 115 and part of side surface 113 of the luminous structure 110. Alternatively, electrical isolation can be obtained by utilizing an insulating layer, as illustrated in FIG. 5 and described hereinbefore in the description of the insulating layer for this embodiment and in the method of manufacturing section.

In the embodiment illustrated in FIG. 5, the first electrode 140 can cover any portion of the insulating layer as long as part of the first electrode is in electrical communication with the second cladding layer 116 through recess 121 of insulating layer 120. For example, the first electrode 140 can cover substantially all of the insulating layer 120, as illustrated in FIG. 5. It is believed that the insulating layer and the first electrode can provide further structural support to the luminous structure 110. Alternatively, when a patterned insulating layer 120 covers only the first cladding layer 112 and the exposed side surfaces of active layer 114, the first electrode 140 can be formed on the second cladding layer 115 and optionally on any portion of the insulating layer 120. Similarly, when a patterned insulating layer covers only the second cladding layer 116 and the exposed side surfaces of the active layer 114, then a patterned first electrode 140 covers the patterned insulating layer 120, e.g., the first electrode is not formed on the first cladding layer 112.

In regard to the second electrode 150, the size and shape are chosen to maximize current flow while minimizing interference with light emitted from the luminous structure 110. Accordingly, the second electrode 150 can have various configurations to improve current spreading and/or decrease interference with emitted light. For example, the second electrode 150 can be formed (i) near at least one edge of the first cladding layer 112, (ii) in the shape of a frame formed on the edge of the first cladding layer, (iii) to include a plurality of smaller electrodes, or a combination thereof. Although not illustrated in FIG. 1H, a conductive layer can also be added to the first surface 109 of the first cladding layer 112 in order to improve current spreading. It is preferred to use a transparent conductive layer, such as ITO (Indium-Tin-Oxide).

The luminous device 1 further includes a conductive substrate 200 bound to at least a portion of the first electrode 140, thereby allowing electrical communication with the second cladding layer 116. Any bonding method known in the art can be utilized. Nonlimiting examples of bonding methods include eutectic bonding, soldering, gold-silicon bonding, and adhesive bonding. Also useful are conductive adhesive layers, as described in U.S. Pat. No. 7,112,456 issued to Park et al. and titled "Vertical GAN Light Emitting Diode and Method for Manufacturing the Same," which is incorporated herein by reference in its entirety.

The conductive substrate 200 can also include a conductive intermediate layer 210 to enhance the bond with the first electrode 140, e.g., compensate for the warpage in the first substrate and/or the second substrate. The intermediate layer 210 (typically used for eutectic bonding) can have lower reflective characteristics than the first electrode. The intermediate layer can be a single layer or multiple layers, e.g., each layer having a different material or alloy.

Further details (e.g., how to make and material constituents) about the luminous device 1 and its various parts (e.g., the luminous structure 110, the first and second electrodes 140, 150, the conductive substrate 200, etc.) can be found in the hereinbefore-described sections on the method of manufacturing a luminous device.

As illustrated in FIG. 5, it is believed that the luminous device 1 illustrated in FIG. 5 can significantly improve light emission, especially when a transparent insulation layer 120 and a reflective first electrode 140 are utilized. In addition to light rays directly emitted from the active area (e.g., light ray L1), the angled side surfaces 113 of the luminous device 1 allow at least once reflected light (e.g., light ray L2) and twice reflected light (e.g., light ray L3) to be emitted from the heterostructure. Accordingly, the directionality of the emitted light can be substantially controlled while substantially increasing the amount of total emitted light. Furthermore, it is believed that, since the first electrode layer 140 is in thermal communication with the second cladding layer surface 115 and at least a portion of at least one side wall surface 113 of the luminous structure 110, the first electrode layer 140 can provide improved conduction of heat away from the luminous structure 110 and into the conductive substrate 200. This cooling effect can be substantial, since the first electrode layer 140 also has a significant contact area with the conductive substrate 200.

Figure 6A:
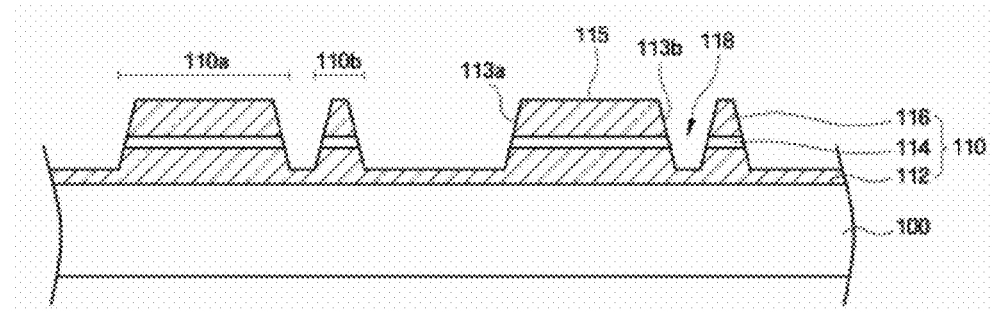
FIGS. 6A-6C illustrate another embodiment of a method for fabricating a luminous device.
Figure 6B:
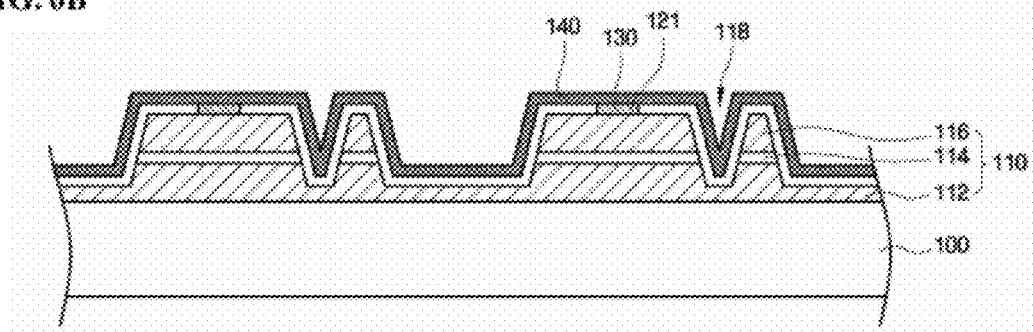
Figure 6C:
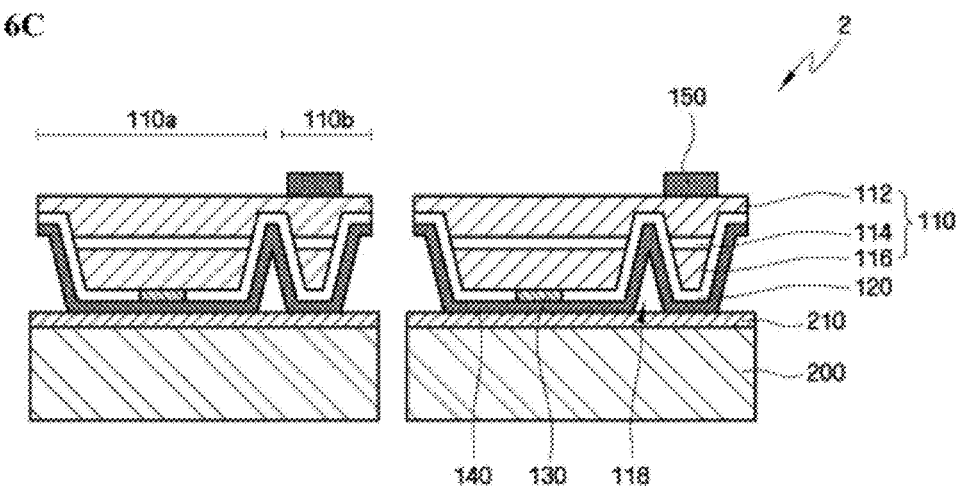

Another embodiment of the present invention is directed to a method of manufacturing a luminous device with the second electrode 150 (e.g., top electrode) provided in a location that does not interfere with light emitted from the heterostructure. Such a configuration can be obtained by forming a grooved luminous structure, as illustrated by FIGS. 6A-6C. This method is a variation of the hereinbefore described method for manufacturing a vertical-type luminous device. Accordingly, the general steps of the method are essentially the same and equally applicable to the present embodiment, except for specific changes described below. For example, the method of this embodiment also undergoes the following process steps: (i) forming the luminous structure; (ii) forming the insulation layer having a recess; (iii) forming the first electrode and optional ohmic layer; (iv) optional patterning of the areas around the luminous structure (which can be conducted at a later time); (v) bonding the first electrode surface to a second conductive substrate; (vi) removing the first substrate; (vii) forming a second electrode; and (viii) separating the second substrate into individual luminous devices. Similarly, all of the variations regarding the insulating layer 120 and the first electrode 140 described hereinbefore for the earlier embodiments (e.g., relating to FIGS. 1A-1H, and FIGS. 3-5) equally apply to this embodiment.

In this embodiment, the pre-formed, multilayered, light-emitting heterostructure (illustrated in FIG. 1A) is subjected to a patterning process to form a luminous structure 110 having at least one groove 118 separating at least the second cladding layer 116 and the active layer 114 of the luminous structure 110, as illustrated in FIG. 6A. One portion of the groove defines side surface 113b of a major portion 110a of the luminous structure 110, and another portion of the groove defines side surface 117 of a minor portion 110b of the luminous structure 110. At least a portion of the first cladding layer 112, therefore, remains as a continuous layer to provide electrical communication between the minor portion 110b and the major portion 110a of the luminous structure. Side surface 113b and/or side surface 117 can be angled as describe hereinbefore in relation to the embodiment illustrated in FIG. 5. In this embodiment, only the major portion 110a of the luminous structure emits light. Although FIGS. 6A-6B illustrate a straight groove 118, the groove can also be curved.

As illustrated by FIGS. 6B and 6C, the remaining process steps of this embodiment are essentially the same (except for the formation of the second electrode) as process steps in the hereinbefore described method of manufacturing a luminous device, which method is incorporated herein by reference in its entirety. For example, an insulating layer 120 (including a recess 121) is formed to conform to the shape of the luminous structure, e.g., the insulating layer is also formed in groove 118. The insulating layer 120 also includes a recess 121, which can be formed by a patterning process. Thereafter, a first electrode layer 140 is formed on the insulating layer 120 (including the region corresponding to the groove) and in recess 121, as illustrated in FIG. 6B. Alternatively, an ohmic layer 130 can be formed in recess 121, as also illustrated in FIG. 6B. Thereafter, a second conductive substrate 200 (which can optionally have a patterned conductive intermediate layer 210) is bound to at least a portion of the first electrode layer 140, and the first substrate 100 is removed, as partially illustrated in FIG. 6C. Furthermore, the conductive substrate 200 can also include a patterned intermediate layer 210 to enhance the bond between the conductive substrate 200 and the first electrode layer 140.

In contrast to the hereinbefore described method, however, the method of this embodiment forms the second electrode 150 on first cladding layer 112 of the minor portion 110b of the luminous structure, as illustrated in FIG. 6C. Accordingly, the second electrode 150 (disposed on the minor portion 110b) does not interfere with light emitted from the major portion 110a of the luminous structure 100. Second electrode 150 can, therefore, be made of any conductive material suitable for first cladding layer 112 (e.g., can be a transparent material, opaque material, or a non-transparent material), and the second electrode 150 can extend across a portion or the entire surface of the first cladding layer of the minor portion of the luminous structure 110b.

Furthermore, although not illustrated in FIG. 6C, a conductive layer can also be added to the surface of the first cladding layer 112 of the major portion 110a and optionally to the minor portion 100b of the luminous structure 110 in order to improve current spreading, e.g., before attaching the second electrode 150. It is preferred to use a transparent conductive layer, such as ITO (Indium-Tin-Oxide), since this conductive layer will cover the light-emitting major portion 110a of the luminous structure 110.

After forming the second electrode 150, the second substrate 200 and the areas around the luminous structure can be separated to form at least one luminous device 2 including at least one luminous structure 110 as illustrated in FIG. 6C. Any process known to the skilled artisan can be used to separate the second substrate and the areas around the luminous structure. Nonlimiting examples of processes for separating the second substrate and the areas around the luminous structure include, but are not limited to, laser sawing, blade sawing, diamond cutting, etching, and combinations thereof.

Another embodiment of the present invention is also directed to a vertical-type luminous device formed on a conductive substrate, wherein the top electrode does not interfere with light emitted primarily towards at least one predetermined direction. Such a luminous device can be manufactured according to the high throughput process described hereinbefore for a luminous device having a grooved luminous structure. Accordingly, all of the details (e.g., materials, configuration, etc.) provided in the hereinbefore described process also applies to this embodiment.

Figure 7:
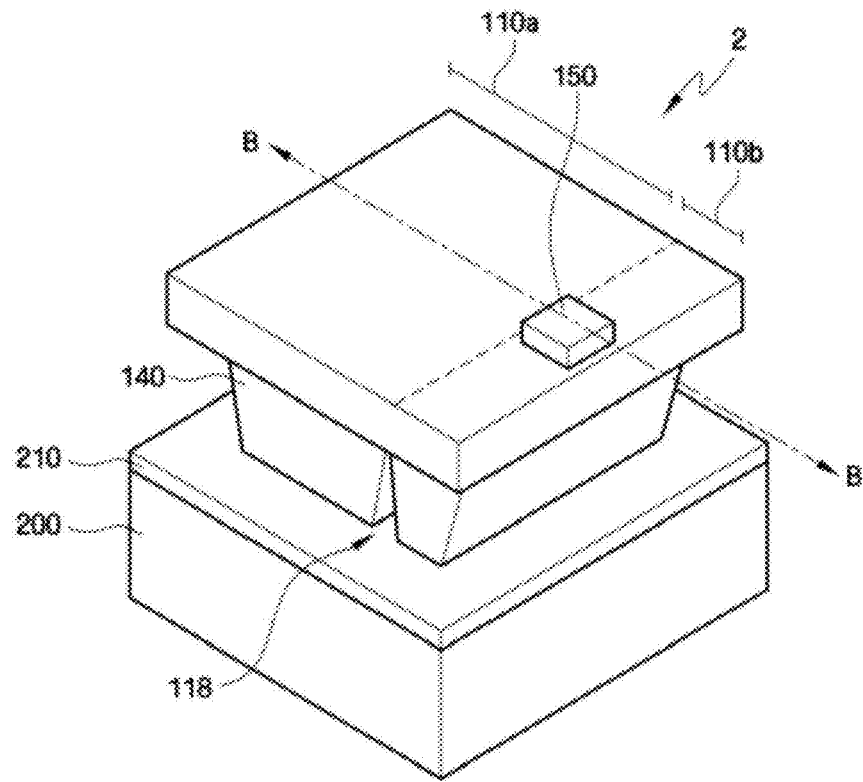
FIGS. 7, 9, and 10 illustrate three embodiments of a luminous device, which can be obtained from the method illustrated by FIGS. 6A-6C.
Figure 8:
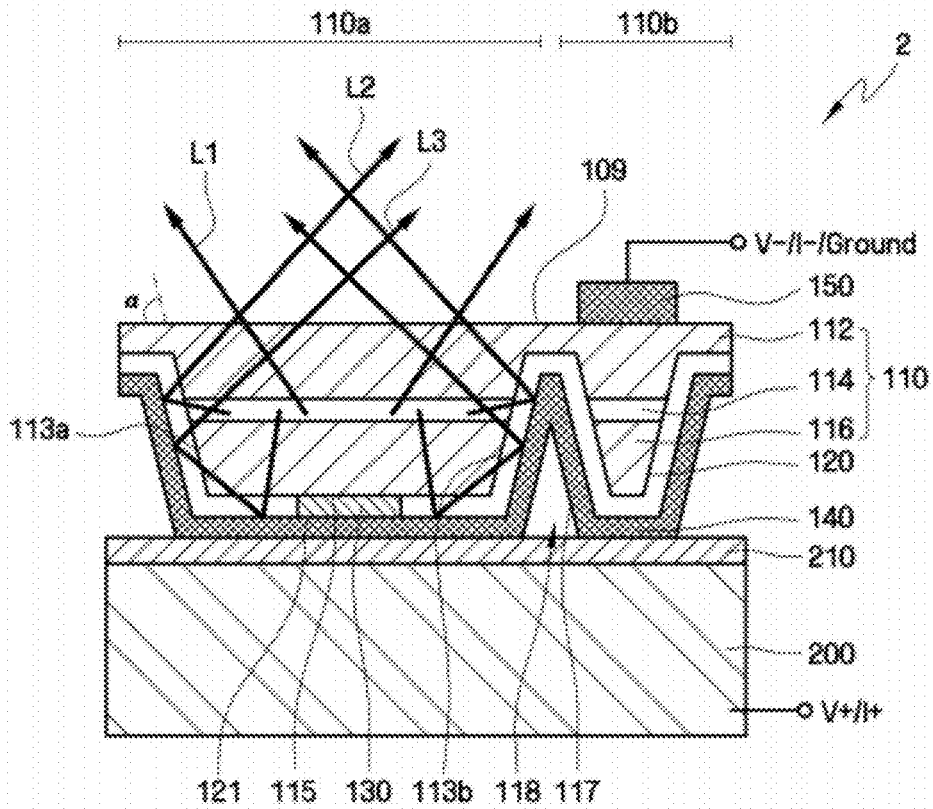
FIG. 8 illustrates a cross-sectional view of the embodiment illustrated in FIG. 7.

FIGS. 7 and 8 illustrate one embodiment of a luminous device 2 having a major light-emitting portion 110a and a minor portion 110b for attaching the second electrode 150. As a result, the second electrode 150 does not interfere with light emission. FIG. 8 is a cross-sectional view of the luminous device 2 along axis B-B illustrated in FIG. 7. As illustrated in FIGS. 7 and 8, the second electrode 150 is formed on a substantially-rectangular (top profile) minor portion 110b of the luminous conductive structure. A groove 118 defines a major portion 110a and a minor portion 110b of the luminous structure 110. Accordingly, the portions of the luminous device 2 corresponding to the portions of the luminous structure 110 will be respectively referred to as the "major portion of the luminous device" and the "minor portion of the luminous device."

The groove 118 separates at least the active layer 114 and the second cladding layer 120 (and optional a part of the first cladding layer 112) of the luminous structure 110. As a result, at least a part of the first cladding layer 112 is continuous throughout the luminous structure 110. Since the second electrode 150 is attached to the first cladding layer 112 in the minor portion of the luminous device 2, electricity will flow along the continuous first cladding layer 112 (or along its surface) and distribute within the major portion of the luminous device 2, where light will be produced.

Except for the absence of second electrode 150, the major portion of the luminous device 2 (corresponding to the major portion 110a) is substantially similar to luminous device 1 illustrated in FIG. 5. Accordingly, all of the detail and variations of luminous device 1 apply equal to the major portion of the luminous device 2. For example, the major portion of the luminous device 2 includes (i) a multilayered, light-emitting luminous structure 110 having a first surface 109, a second surface 115, and at least one side surface 113a (or side surface 113b forming part of the groove 118), (ii) an insulating layer 120 having a recess 121 and covering the second surface 115 and at least portion of the sides 113a, 113b of the luminous structure, (iii) a first electrode 140 connected to the major portion of the luminous structure 110, and (iv) a conductive substrate 200 bound to the first electrode 140. The major portion of the luminous device 2 can further include an ohmic region 130 situated to contact the second surface 115 of the luminous structure 110 and the second electrode 140, e.g., the ohmic region 130 can be placed in a recess within insulating layer 120. The luminous device 2 can further include an intermediate layer 210 to enhance the bond, e.g., compensate for the warpage in the conductive substrate 200.

Furthermore, the exposed surface of the first cladding layer 112 of the major portion 110a can also be textured (not shown) before attaching the second electrode 150 on first cladding layer 112 of the minor portion 110b of the luminous structure to increase the light emitting efficiency. In order to enhance the attachment of the second electrode 150 to the exposed surface of the first cladding layer 112 of the minor portion 110b, the area of the first cladding layer 112 of the minor portion 110b where the second electrode 150 attaches can be free of texturing. It is believed that surface texturing reduces the total internal reflection resulting from the difference in refractive index between the first cladding layer 112 of the major portion 110a and air. Surface texturing can be done by any known process known to the skilled artisan. One example of such a process is the use of a wet etchant, such as KOH.

As illustrated in FIG. 8, the minor portion 110b of the luminous device 2 includes a second electrode 150 in electrical communication with the first cladding layer 112. The second electrode 150 can extend across a portion or the entire surface of the first cladding layer of the minor portion of the luminous structure 110b. For example, the second electrode can have a crescent shape to enhance current distribution. Accordingly, the minor portion 110b of the luminous device 2 also includes an insulation layer 120 and optionally the first electrode layer 140. Although the minor portion of the luminous device 2 does not require a first electrode layer 140, it may be more convenient to include it during high throughput processing.

It is believed that the luminous device 2 illustrated in FIGS. 7 and 8 can significantly improve light emission with the second electrode 150 placed in a non-interfering position, and especially when a transparent insulation layer 120 and a reflective first electrode 140 are utilized. In addition to light rays directly emitted from the active area (e.g., light ray L1), the angled side surfaces 113 of the luminous device 1 allow at least once reflected light (e.g., light ray L2) and twice reflected light (e.g., light ray L3) to be emitted from the heterostructure. Accordingly, the directionality of the emitted light can be substantially controlled while substantially increasing the amount of total emitted light. Furthermore, it is believed that, since the first electrode layer 140 is in thermal communication with the second cladding layer surface 115 and at least a portion of at least one side wall surface 113 of the major portion 110a of the luminous structure 110, the first electrode layer 140 can provide improved conduction of heat away from the luminous structure 110 and into the conductive substrate 200. This cooling effect can be substantial, since the first electrode layer 140 also has a significant contact area with the conductive substrate 200.

Figure 9:
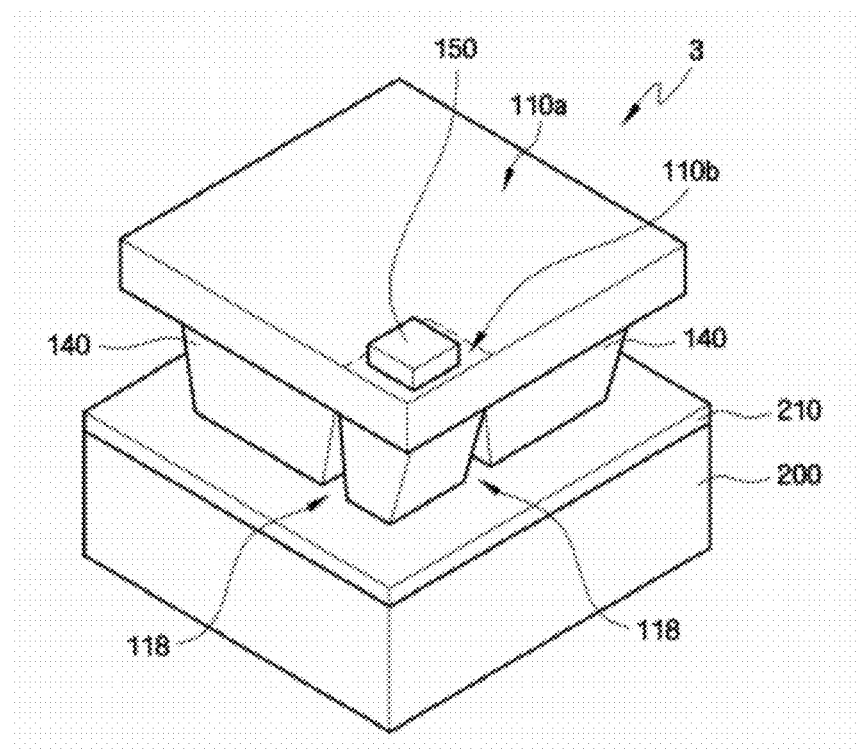

In an alternative embodiment, the hereinbefore described process for manufacturing the grooved luminous structure can be modified to manufacture a luminous device 3 having a second electrode 150 formed on a substantially-square (top profile), minor portion 110b of the luminous structure 110 (e.g., defined by two grooves 118) in a corner quadrant, as illustrated in FIG. 9. Accordingly, when viewed from a top profile, the substantially-square minor portion 110b is formed at one corner quadrant of a luminous device having a square shaped top profile. In another variation of this embodiment, luminous device 3 can have more than one substantially-square minor portions (not shown), e.g., one on opposite corner quadrants, or one on each corner quadrant. In these alternative embodiments, the preformed, multilayered, light emitting heterostructure can be patterned to form a luminous structure having a plurality of grooves.

Figure 10:
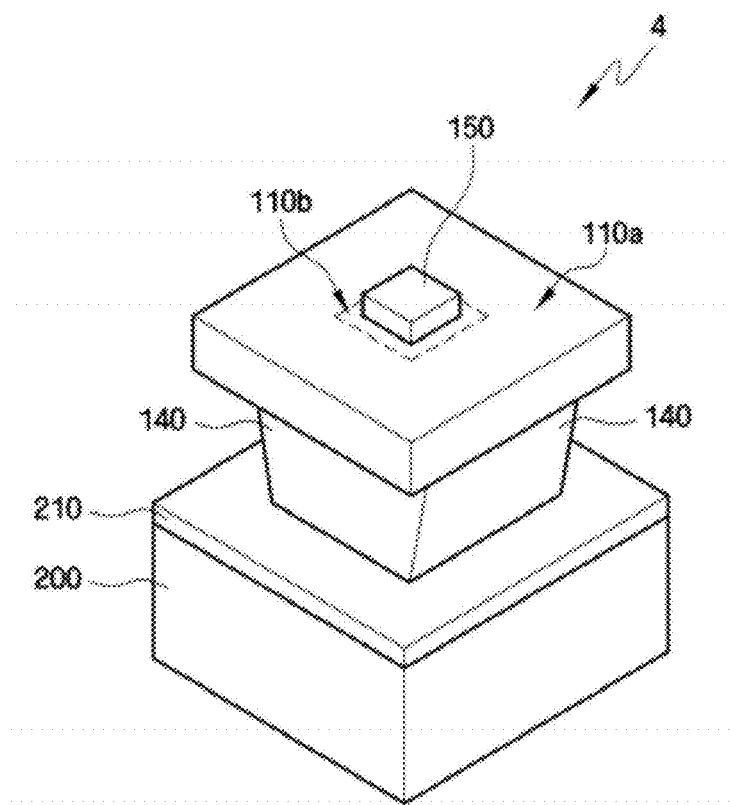

In another alternative embodiment, a luminous device 4 can include a minor portion 110b of the luminous structure formed in a central location of the luminous structure 110, as seen from a top profile and illustrated in FIG. 10. In this embodiment, four grooves in a square formation (or a single groove in a circular formation) can be utilized to form the minor portion 110b as an island in a central location of the luminous structure 110. Since the second electrode 150 is formed on the minor portion 110b, its central location can help to increase current distribution outward in a radial direction from the center to the outer light emitting major portion 110a of the luminous structure 110. In this embodiment, the insulating layer has a recess (and optionally an ohmic layer) having a substantially square shape corresponding to the shape of the major portion.

Although all of the shapes referenced hereinbefore are square or rectangular, other shapes are also possible for any part of the luminous devices described hereinbefore. For example, the minor portions of the luminous structure can have a circular or oval top profile shape. In this example, a single groove will have a circular or oval shape.

In another embodiment, the present invention is directed to a method of manufacturing a vertical-type luminous device having a lens, as illustrated in FIGS. 11A-11D. This method is a variation of the hereinbefore described methods for manufacturing a vertical-type luminous device and a vertical-type luminous device having a groove. In this embodiment, a portion of the first cladding layer is utilized to form the lens. It is believed that the curvature of the lens increases the light emitting efficiency by reducing the escape cone angle, which is a phenomena resulting from the difference in refractive indexes between the first cladding layer and air.

Figure 11A:
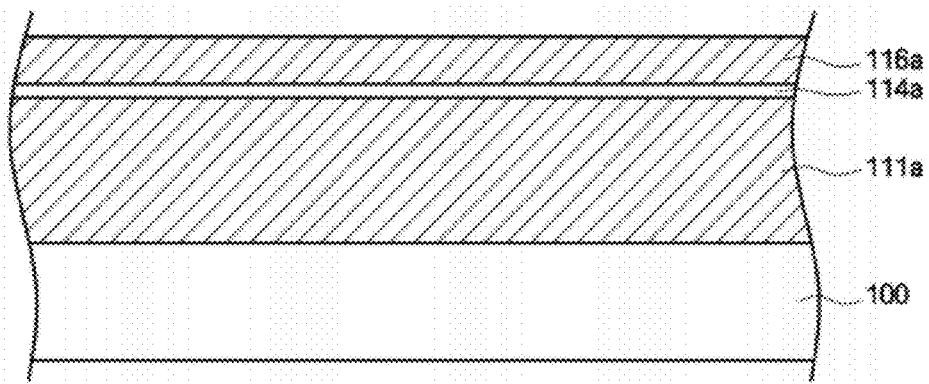
FIGS. 11A-11D illustrate another embodiment of a method for fabricating a luminous device.

In this embodiment, the method utilizes a pre-formed, multilayered, light-emitting heterostructure, as illustrated in FIG. 11A. Similar to the preformed heterostructure described in relation to FIG. 1A, the preformed heterostructure of this embodiment illustrated in FIG. 11A includes at least a first substrate 100, a first cladding layer 111a, an active layer 114a, and a second cladding layer 116a. However, the preformed heterostructure in this embodiment has a first cladding layer 111a that is substantially thicker to compensate for the lens portion. In this embodiment, the thickness of the first cladding layer 111a is typically greater than about one tenth the length of the shortest side (or shortest diameter) of the first surface 109 of the luminous structure 110 on which the lens will be formed, when viewed from a top profile. In the hereinbefore described grooved luminous devices, only the first surface 109 of the major portion 110a is relevant for determining the shortest side (or shortest diameter). Such a thick first cladding layer 111a can be obtained by any method known to the skilled artisan, such as vapor phase epitaxy.

The other process steps are essentially the same as the process steps of the hereinbefore described methods for manufacturing a vertical-type luminous device and a vertical-type luminous device having a groove. For example, the method of this embodiment also undergoes the following process steps: (i) forming the luminous structure; (ii) forming the insulation layer having a recess; (iii) forming the first electrode and optional ohmic layer; (iv) optional patterning of the areas around the luminous structure (which can be conducted at a later time); (v) bonding the first electrode surface to a second conductive substrate; (vi) removing the first substrate; (vii) forming a second electrode; and (viii) separating the second substrate into individual luminous devices.

Figure 11B:
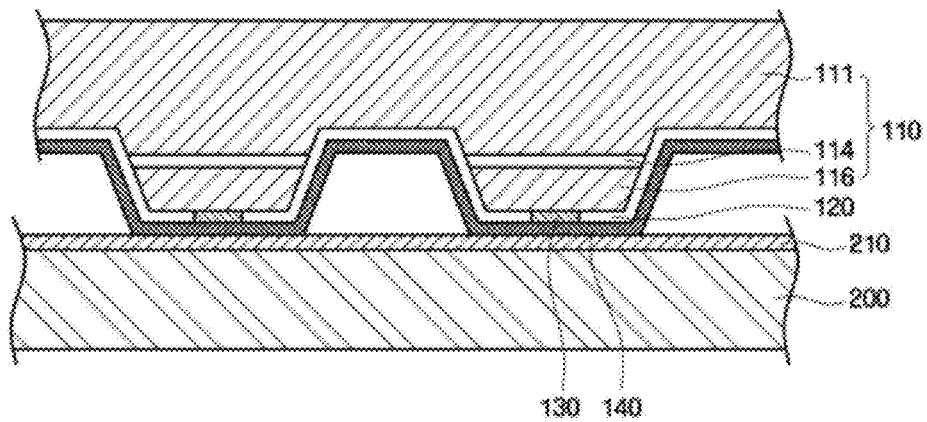
Figure 11C:
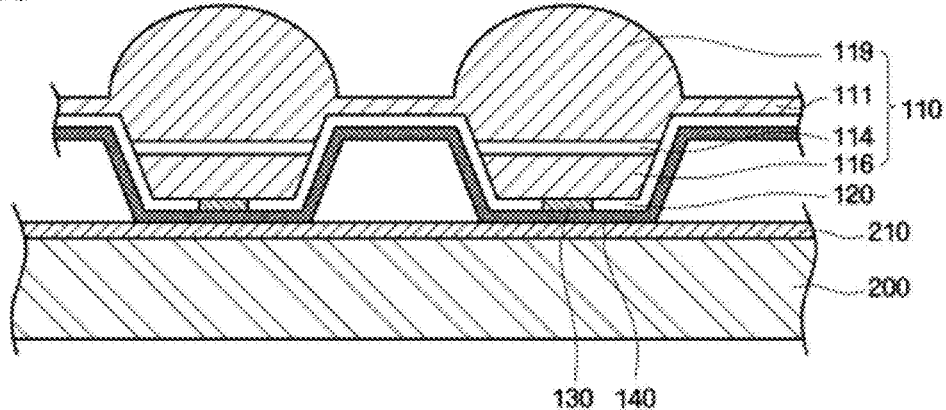

However, in this embodiment, the method further includes an additional step of forming a lens 119 from the first cladding layer 111, as illustrated in FIG. 11C. After the process step of removing the first substrate, the first cladding layer 111 is exposed, as illustrated in FIG. 11B. Thereafter, a patterning process is conducted on the first cladding layer 111 using a shaped photo resist pattern to form the lens 119 from the first cladding layer 111 and define the areas around the lens, as illustrated in FIGS. 11B and 11C. An example of a pattern process to form the lens is described in Stern et al., "Dry etching for coherent refractive microlens arrays," *Optical Engineering*, Vol. 33, No. 11, p. 3547-51 (November 1994), and U.S. Pat. No. 5,948,281, issued to Okazaki et al. on Sep. 7, 1999 and titled "Microlens array and method of forming same and solid-state image pickup device and method of manufacturing same," which are incorporated herein by reference in its entirety.

Although FIGS. 11A-11D illustrate a convex lens, the first cladding layer 111 can be shaped into any desirable shape to obtain the desired light emitting pattern. For example, in a variation of the above process step, a plurality of lenses 119 can be obtained by altering the lens shaping pattern to provide a plurality of smaller lenses, as illustrated in FIG. 11E.

Figure 11D:
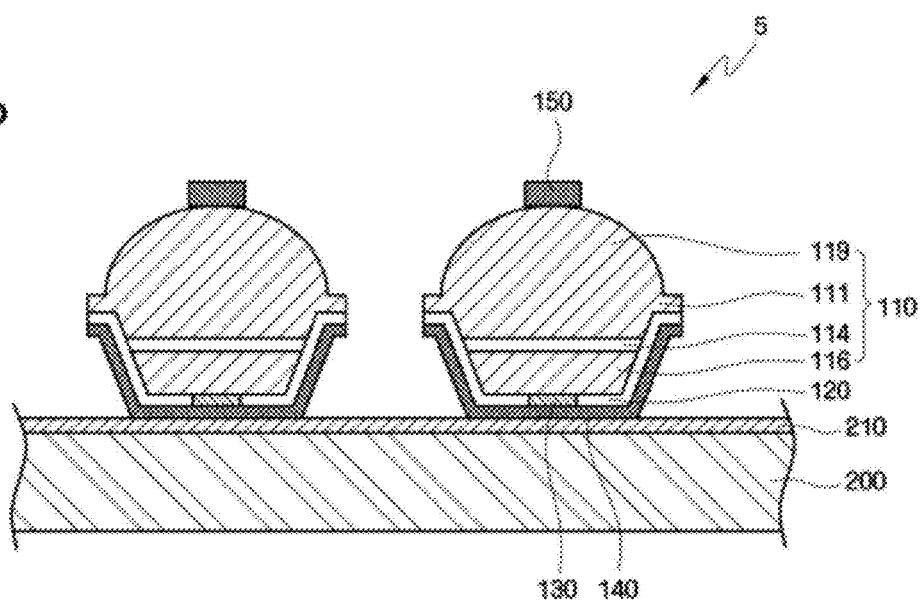
Figure 11E:
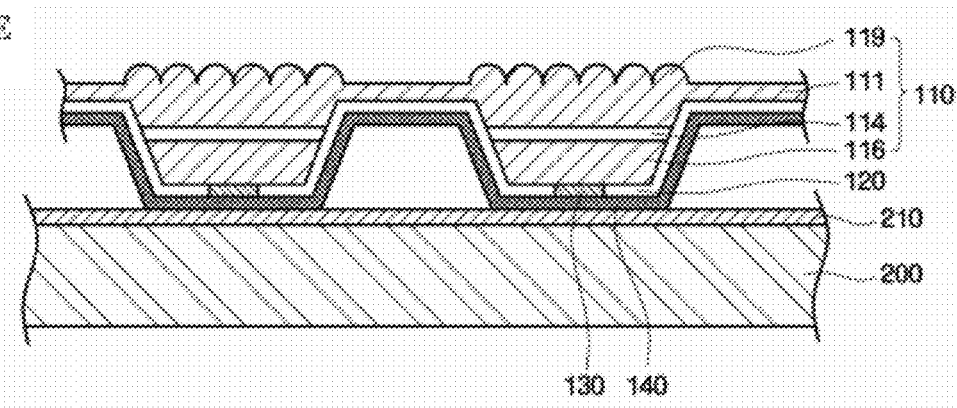
FIG. 11E illustrates a variation of the method illustrated in FIGS. 11A-11D.

After forming the at least one lens, the second electrode 150 is formed on the lens (or a plurality of lens) made from the first cladding layer 111, as illustrated in FIG. 11D and as previously described hereinbefore. In embodiments where the luminous device has a groove, the second electrode 150 can be formed on the first cladding layer 111 of the minor portion of the luminous device.

The present invention is also directed to a vertical-type luminous device formed on a conductive substrate, wherein the luminous device includes a lens. Any of the previously described embodiments can include a lens as herein described. Such a luminous device can be manufactured according to the high throughput process described hereinbefore for a luminous device having a lens.

Figure 12:
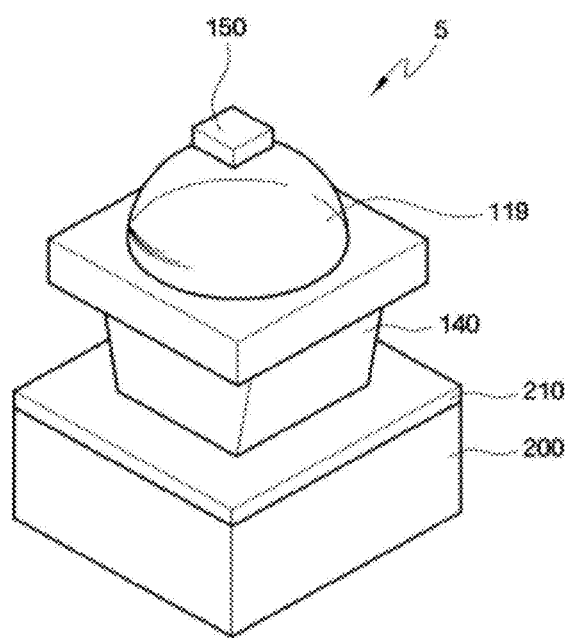
FIGS. 12 and 14 illustrate two embodiments of a luminous device, which can be obtained from the method illustrated by FIGS. 11A-11D.
Figure 13:
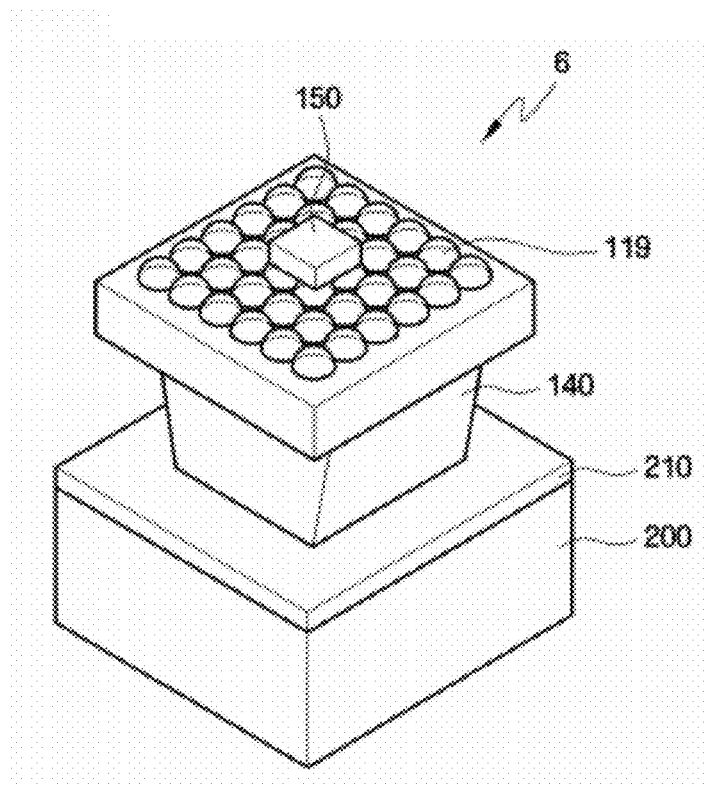
FIG. 13 illustrates another embodiment of a luminous device, which can be obtained from the method illustrated by FIG. 11E.
Figure 14:
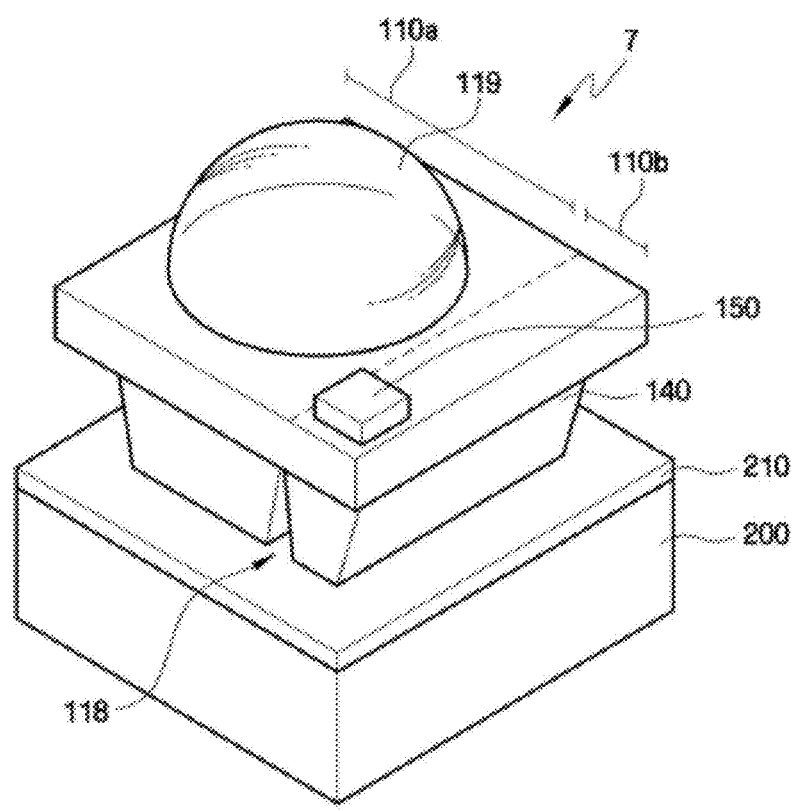

FIGS. 12-14 illustrate three variations of a vertical-type luminous device having a lens formed from the first cladding layer 111. FIGS. 12 and 13 respectively illustrate luminous devices having one large lens and a plurality of smaller lenses. In FIG. 12, the luminous device 5 comprises a luminous structure having a single lens 119, wherein the second electrode 150 is bound to the lens. In FIG. 13, the luminous device 6 comprises a luminous structure having a plurality of lenses 119, wherein the second electrode 150 is bond to a group of centrally-located small lenses. Alternatively, the area where the second electrode is bound can be flat, e.g., devoid of lenses. These luminous structures further include a first electrode 140 which is bound to a conductive substrate 200. The conductive substrate 200 can further include an intermediate layer 210 to enhance the bound, e.g., compensate for warpage in the conductive substrate 200.

Similarly, FIG. 14 illustrates a luminous device 7 having a groove 118, which defines a major portion 110a and a minor portion 110b of the luminous device. The major portion of the luminous device includes a lens 119, and the minor portion of the luminous device includes the second electrode 150. As discussed hereinbefore, in this embodiment, the second electrode 150 does not interfere with light emitted from the major portion of the luminous device. Accordingly, the second electrode 150 can be made from any desired conductive material, and it can take any shape, e.g., the second electrode 150 can cover the entire surface of the first cladding layer in the minor portion of the luminous device. Although not illustrated in FIG. 13, the luminous device 7 can further include a current spreading layer on the surface of the first cladding layer and optionally the surface of the lens 119.

In another embodiment, the present invention is directed to a method of manufacturing a vertical-type luminous device having an embedded zener diode within the conductive substrate 200. Although the embodiments herein describe the conductive substrate as typically comprising a p-type substrate having at least one n-type doped region, the conductive substrate can also be an n-type substrate having at least one p-type doped region. In addition, all of the embodiments herein can also include a first cladding layer having a lens portion, as provided hereinbefore. Furthermore, although luminous devices hereinbefore described are utilized, any suitable vertical-type luminous device can be substituted in, thereby utilizing the embedded zener diode in the conductive substrate 200.

Figure 15:
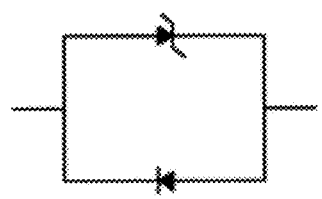
FIG. 15 is a circuit diagram illustrating a luminous device having a zener diode.

FIG. 15 provides a circuit diagram illustrating the functional aspects of the luminous device and the zener diode. The conductive substrate 200 is doped with a compound that is a conductive type opposite to the conductive type of the conductive substrate. For example, when a p-type substrate 200 is used, selected portions of the substrate are doped with an n-type compound, and vice versa, to create the zener diode. The doped regions of the conductive substrate 200 are then placed in electrical communication with the second cladding layer 116 of a luminous structure 110, which is the same semiconductor type as the conductive substrate 200. For example, an n-typed doped region of the conductive substrate 200 is placed in electrical communication with the p-type cladding layer 116 of a luminous structure 110. It is believed that the zener diode effectively protects the luminous structure 110 from harmful surges in reverse bias voltage, e.g., from electrostatic discharge.

Figure 16A:
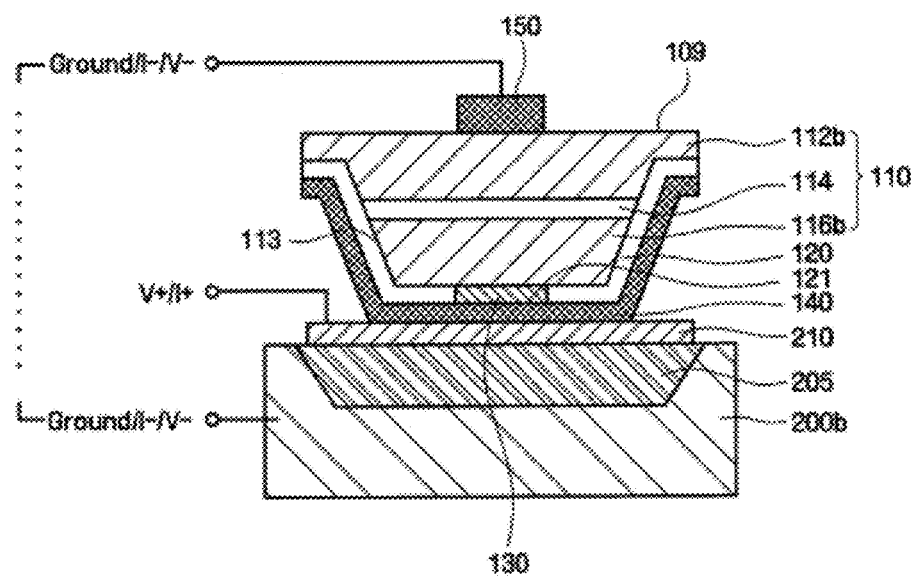
FIGS. 16A and 16B illustrate two embodiments of a luminous device having a zener diode.

FIG. 16A illustrates one embodiment of a luminous device 8 comprising a zener diode. The luminous device 8 illustrated in FIG. 16A is substantially similar to the luminous device 1 illustrated in FIG. 5. However, the luminous device 8 includes a zener diode comprising a p-type conductive substrate 200b having an n-type doped region 205. Furthermore, the first cladding layer 112b is n-type, and the second cladding layer 116b is p-type. Accordingly, when harmful reverse bias voltages enter n-type doped region 205, it will flow harmlessly into the p-type substrate 200b and protect the luminous structure 110. When an intermediate layer 210 is used, as illustrated in FIG. 16A, the intermediate layer is only in electrical communication with doped region 205, i.e., the intermediate layer 210 should not contact the undoped regions of the conductive substrate 200b.

Figure 16B:
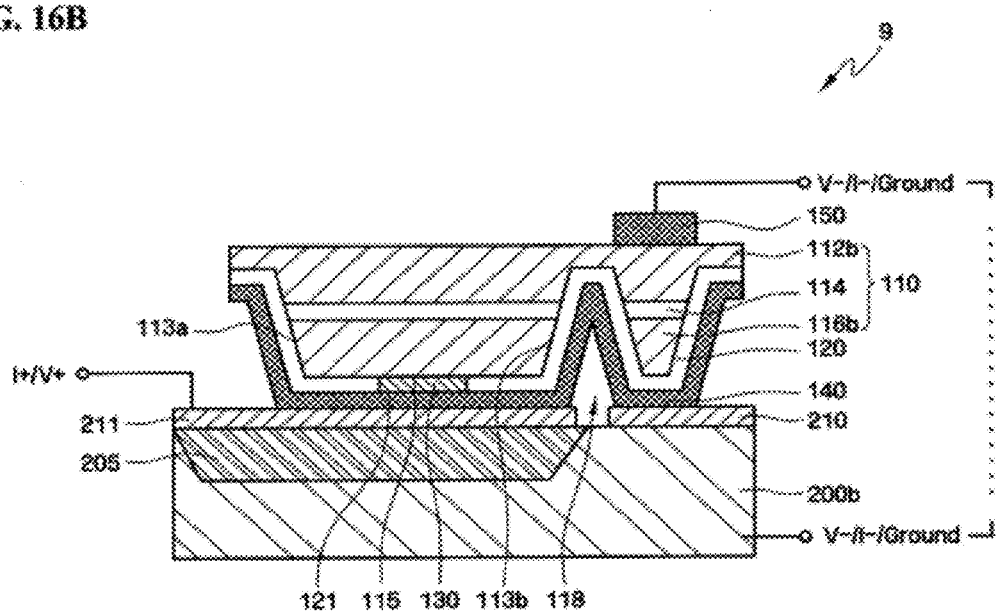

Similarly, FIG. 16B illustrates another embodiment of a luminous device 9 comprising a zener diode. The luminous device 9 having a groove illustrated in FIG. 16B is substantially similar to the luminous device 2 illustrated in FIG. 8. However, the luminous device 9 includes a zener diode comprising a p-type conductive substrate 200b and an n-type doped region 205. Furthermore, the first cladding layer 112b is n-type, and the second cladding layer 116b is p-type. Accordingly, when harmful reverse bias voltages enter n-type doped region 205, it will flow harmlessly into the p-type substrate 200b and protect the luminous structure 110. When an intermediate layer 211 is used, as illustrated in FIG. 16B, the intermediate layer should only be in electrical communication with doped region 205, i.e., the intermediate layer 211 should not contact the undoped regions of the conductive substrate 200b.

These luminous devices 8 and 9 can be obtained by including additional process steps to the hereinbefore described methods for manufacturing a vertical-type luminous device and a vertical-type luminous device having a groove. The additional process steps can include the following: (i) doping the conductive substrate with the appropriate dopant (e.g., opposite conductive type to the substrate) in selected regions that are in electrical communication with the portion of the first electrode layer corresponding to the recess 121 in insulating layer 120; (ii) optionally forming a patterned conductive intermediate layer 210 (and 211 for the luminous device having a groove) on the doped regions 205 of the conductive substrate 200b; (iii) aligning and attaching the doped regions 205 or the patterned conductive intermediate layer 210 (corresponding to the doped regions 205) with the portion of the first electrode layer corresponding to the recess 121 in insulating layer 120; and any combination of the steps thereof. The patterned conductive intermediate layer 210 is preferably formed within the doped regions 205 so as not to be in contact (or in direct electrical communication) with the undoped regions of the conductive substrate 200b.

The present invention is also directed to luminous packages (e.g., chip scale packages) comprising the vertical-type luminous devices hereinbefore described. These packages can be utilized in any suitable luminous system by connecting the packages to a power source. Since the directionality of the emitted light can be substantially controlled in the luminous packages described herein, chip scale packaging can be substantially simplified. Although traditional packages (e.g., including a reflector or reflective side and back surfaces) can be used, such traditional packaging is not required, since the luminous packages described herein already are capable of substantially controlling the directionality of the emitted light. Luminous packages can be divided into two large categories: unencapsulated and capsulated. As used herein, reference number 300 is a submount, which is a substrate having at least two conductive regions for supplying electricity to the luminous device. Nonlimiting examples of a submount include a circuit board or a printed circuit board. For simplicity, however, reference number 300 is referred to here in as a circuit board.

Figure 17:
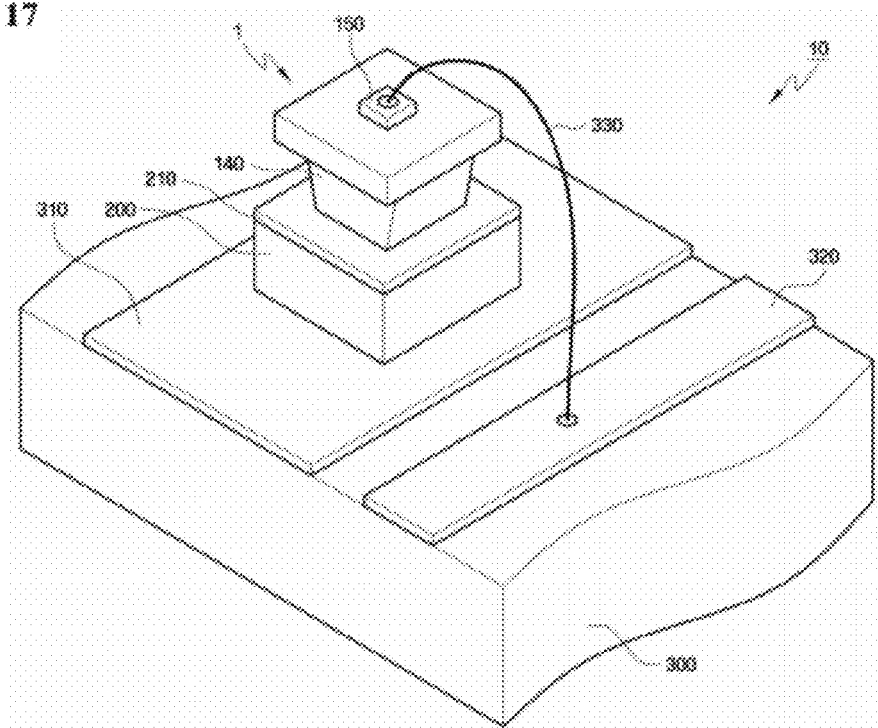
FIG. 17 illustrates an embodiment of a luminous package.
Figure 18:
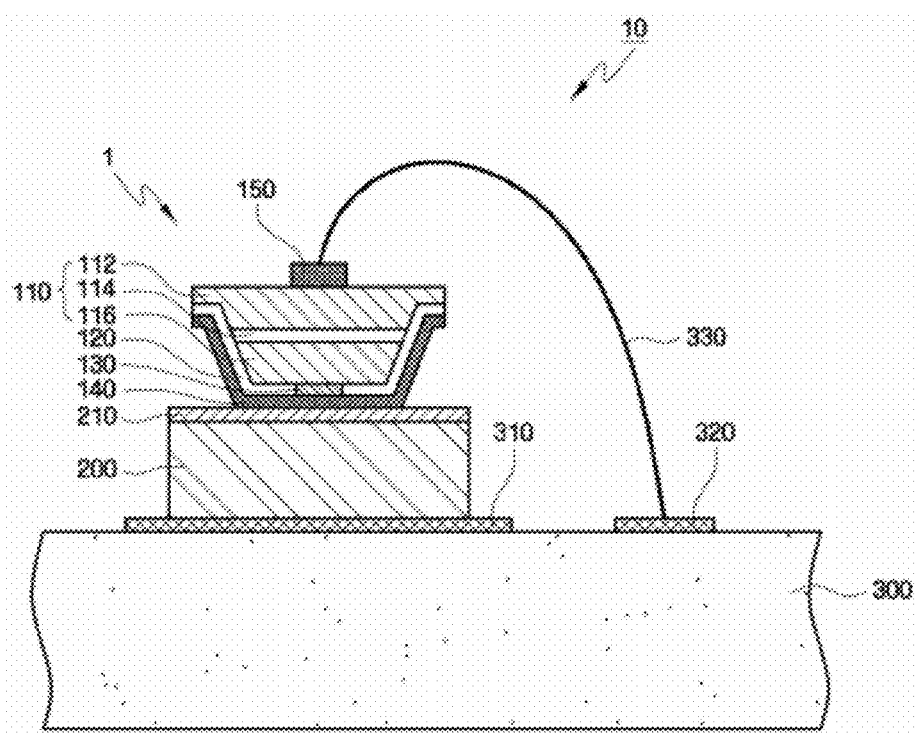
FIG. 18 illustrates a cross-sectional view of the embodiment illustrated in FIG. 17.

FIGS. 17 and 18 illustrate one embodiment of an unencapsulated luminous package 10, which comprises a luminous device 1 bound to a first conductive region 310 (also called a contact) on a circuit board 300. The circuit board 300 also includes a second conductive region 320 (also called a contact) on the circuit board 300, and a wire 330 provides electrical communication (e.g., a wire bond) between the second electrode 150 and the second conductive region 320. This embodiment requires only one wire 330 electrical connection, because the second electrical connection is provided by the conductive substrate 200 by way of conductive intermediate layer 210, if utilized. Although luminous device 1 is substantially the same as the device illustrated in FIG. 5, any of the hereinbefore described luminous devices can be substituted in for luminous device 1 in this embodiment.

FIGS. 19, 20, 21A, and 21B illustrate various embodiments of an unencapsulated luminous package comprising a luminous device having a zener diode. Although these embodiments describe the use of luminous devices hereinbefore described, any suitable vertical-type luminous device can be substituted in, thereby utilizing the embedded zener diode in the conductive substrate 200.

Figure 19:
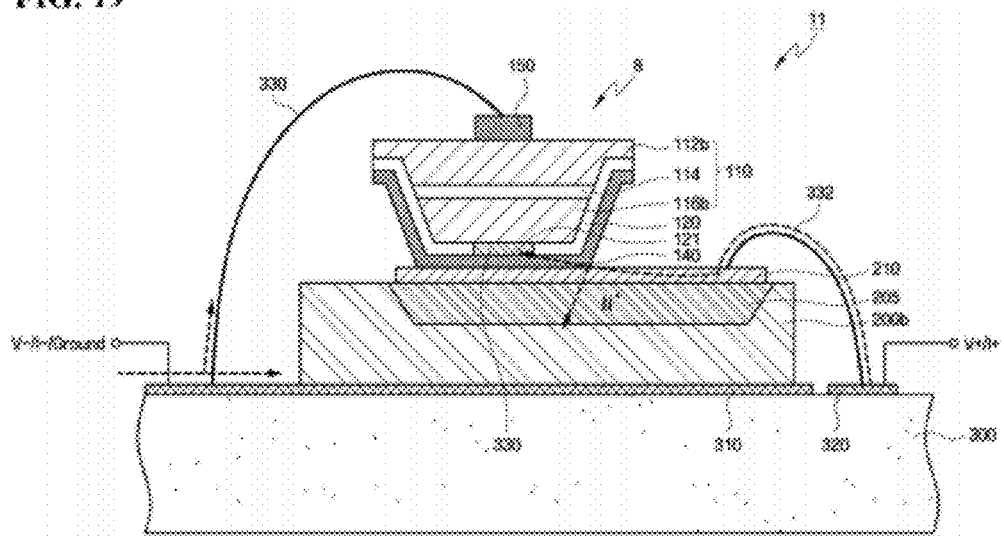
FIGS. 19 and 20 illustrate two embodiments of luminous packages having a zener diode.

FIG. 19 illustrates another embodiment of an unencapsulated luminous package 11 comprising a luminous device 8 having a zener diode, which device is bound to a first conductive region 310 on a circuit board 300. The luminous device 8 has a p-type conductive substrate 200b with an n-type doped region 205. A conductive intermediate layer 210 (i) enhances the bond between a surface of a first electrode 140 (of the luminous structure 110) and the p-type second substrate 200b and (ii) covers (or contacts) at least a portion of the n-type doped region 205 of p-type conductive substrate 200b. The intermediate layer 210 is only in electrical communication with doped region 205, i.e., the intermediate layer 210 should not contact the undoped regions of the conductive substrate 200b. A first wire 330 provides electrical communication between a second electrode 150 (of the luminous structure 110) and the first conductive region 310, and a second wire 332 provides electrical communication between conductive intermediate layer 210 and a second conductive region 320 on the circuit board 300.

Figure 20:
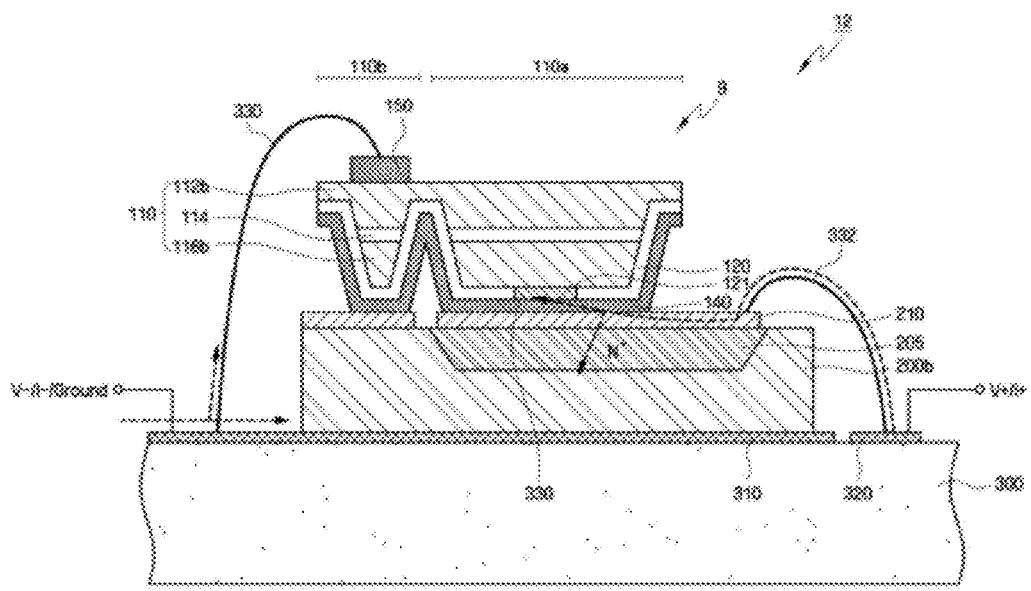

FIG. 20 illustrates another embodiment of an unencapsulated luminous package 12 comprising a luminous device 9 having a zener diode, which device is bound to a first conductive region 310 on a circuit board 300. The luminous device 9 includes luminous structure 110 having a light emitting major portion 110a and a minor portion 110b on which a second electrode 150 is disposed. Luminous device 9 also has a p-type conductive substrate 200b with an n-type doped region 205, as substantially illustrated in FIG. 16B. A first conductive intermediate layer 210 (i) enhances the bond between a surface of a first electrode 140 (located on the light emitting major portion 110a of the luminous structure 110) and the p-type conductive substrate 200b and (ii) covers (or contacts) at least a portion of the n-type doped region 205 of p-type conductive substrate 200b. The intermediate layer 210 is only in electrical communication with doped region 205, i.e., the intermediate layer 210 should not contact the undoped regions of the conductive substrate 200b. A second conductive intermediate layer 211 enhances the bond between a surface of a first electrode 140 (located on the minor portion 110b of the luminous structure 110) and the p-type substrate 200b. The first and second conductive intermediate layers 210, 211 can be made of the same material or different materials. It is preferable to provide a gap between the first and second conductive intermediate layers 210, 211. A first wire 330 provides electrical communication between a second electrode 150 (located on the minor portion 110b of the luminous structure 110) and the first conductive region 310, and a second wire 332 provides electrical communication between conductive intermediate layer 210 and a second conductive region 320 on the circuit board 300.

Luminous package 11 (illustrated in FIG. 19) and luminous package 12 (illustrated in FIG. 20) can be utilized in a substantially similar way. Luminous package 11 and luminous package 12 are activated (e.g., to emit light) by place a forward bias on the luminous package, e.g., placing a negative bias on the first conductive region 310 and a positive bias on the second conductive region 320. The electrons flow from first conductive region 310 to the second electrode 150 via first wire 330, as illustrated by the dashed arrows on the left side of FIGS. 19 and 20. When a reverse bias is placed on the luminous package, e.g., placing a positive bias on the first conductive region 310 and a negative bias on the second conductive region 320, electrons will flow from the second conductive region 320 to conductive intermediate layer 210. When the voltage in reverse bias reaches a certain breakdown voltage (e.g., dangerous levels of electrostatic discharge), the zener diode (i.e., the n-type doped region 205 and the p-type conductive substrate 200b) will allow flow of electrons through the n-type doped region 205 and the p-type conductive substrate 200b and exit through first conductive region 310, thereby protecting the luminous device 8, 9.

Figure 21A:
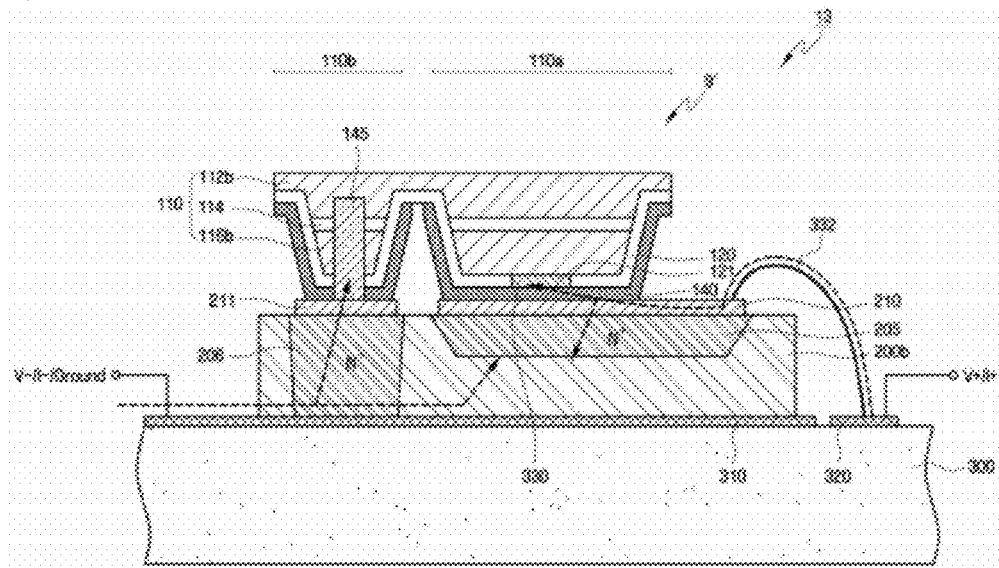
FIGS. 21A and 21B illustrate two additional embodiments of luminous packages having a zener diode.

FIG. 21A illustrates another embodiment of an unencapsulated luminous package 13 comprising a modified luminous device 9' having a zener diode, which device is bound to a first conductive region 310 on a circuit board 300. The luminous device 9' includes luminous structure 110 having a light emitting major portion 110a and a minor portion 110b on which a second electrode 150 is disposed, as substantially illustrated in FIG. 16B for luminous package 9. However, this luminous device 9' is modified, because (i) it includes a through via contact 145 in the minor portion of the luminous structure instead of a second electrode 150 and (ii) the first electrode layer 140 is removed in the area between the major portion 110a and minor portion 110b of the luminous structure 110. The through via 145 contacts and extends from the n-type first cladding layer 112b to the exterior of the insulating layer 120. The through via 145 can include a central conductive material and optionally an outer insulation layer (not shown). Through vias can be formed by any method known in the art. Nonlimiting examples of acceptable processes for forming through vias can be found in U.S. Pat. No. 6,916,725 issued on Jul. 12, 2005 to Yamaguchi and titled "Method for Manufacturing Semiconductor Device, and Method for Manufacturing Semiconductor Module," U.S. Pat. No. 7,193,297 issued on Mar. 20, 2007 to Yamaguchi and titled "Semiconductor Device, Method for Manufacturing the Same, Circuit Substrate and Electronic Device", and U.S. Pat. No. 7,214,615 issued on May 8, 2007 to Miyazawa and titled "Method of manufacturing semiconductor device, semiconductor device, circuit substrate and electronic apparatus," which are all incorporated herein by reference in their entirety.

Luminous device 9' also has a p-type conductive substrate 200b with a first n-type doped region 205 and a second n-type doped region 206. A first conductive intermediate layer 210 (i) enhances the bond between a surface of a first electrode 140 (located on the major portion 110a of the luminous structure 110) and the p-type conductive substrate 200b and (ii) covers (or contacts) at least a portion of the first n-type doped region 205 of p-type conductive substrate 200b. Similarly, a second conductive intermediate layer 211 (i) enhances the bond between a surface of a first electrode 140 (located on the minor portion 110b of the luminous structure 110) and the p-type conductive substrate 200b and (ii) covers (or contacts) at least a portion of the second n-type doped region 206 of p-type conductive substrate 200b. The intermediate layer 210 is only in electrical communication with the first n-type doped region 205, i.e., the intermediate layer 210 should not contact the undoped regions of the conductive substrate 200b, and the intermediate layer 211 is only in electrical communication with second n-type doped region 206. The first and second conductive intermediate layers 210, 211 can be made of the same material or different materials. In this embodiment, a gap is provided between the first and second conductive intermediate layers 210, 211. The through via 145 provides electrical communication between the n-type first cladding layer 112b (located in the minor portion 110b of the luminous structure 110) and the first conductive region 310 via the second conductive intermediate layer 211 and the second n-type doped region 206 of conductive substrate 200b, and a wire 332 provides electrical communication between conductive intermediate layer 210 and a second conductive region 320 on the circuit board 300.

Figure 21B:
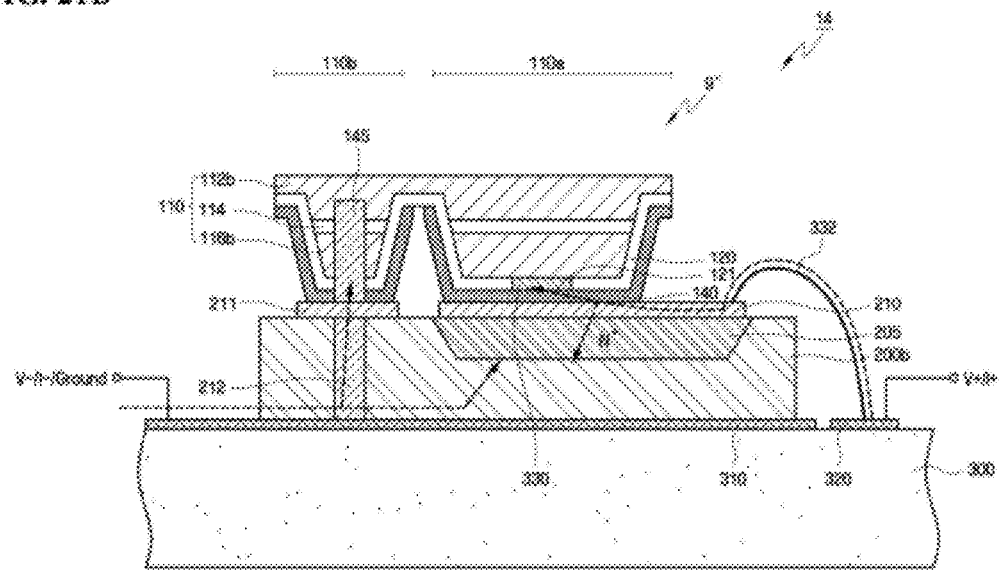

FIG. 21B illustrates another embodiment of an unencapsulated luminous package 14 comprising a modified luminous device 9" having a zener diode, which device is bound to a first conductive region 310 on a circuit board 300. Luminous package 14 of this embodiment is substantially similar to luminous package 13 illustrated in FIG. 21A. Accordingly, the description for luminous package 13 discussed hereinbefore also applies to luminous package 14. However, the p-type conductive substrate 200b of luminous device 14 has a through via contact 212 instead of a second n-type doped region 206. The through via contact 212 can include a central conductive material and optionally an outer insulation layer (not shown) As a result, the second conductive intermediate layer 211 (i) enhances the bond between a surface of a first electrode 140 (located on the minor portion 110b of the luminous structure 110) and the p-type conductive substrate 200b and (ii) is in electrical communication (or contact) with through via contact 212 in p-type conductive substrate 200b.

Luminous device 9' (illustrated in FIG. 21A) and 9" (illustrated in FIG. 21B) can be obtained by modifying the hereinbefore described methods for manufacturing (i) a vertical-type luminous device having a groove (luminous device 2 illustrated in FIG. 8) and (ii) a vertical-type luminous device having a groove and a zener diode (luminous device 8 illustrated in FIG. 16B). Two common additional process steps for both luminous devices 9' and 9" can include the following: (i) locally removing the first electrode layer 140 from at least a portion of the groove area 118 (e.g., the area between the major portion 110a and minor portion 110b of the luminous structure 110) to disconnect the first electrode layer 140 of the major portion 100a from the minor portion 100b or forming a patterned first electrode layer disconnected in the groove area 118; and (ii) forming a through via contact 145 (e.g., forming a via up to the first cladding layer 112 and filling the via with a conductive material) in the minor portion 110b of luminous structure 110 before or after forming the first electrode layer, as illustrated in FIG. 6B. These additional steps are conducted before bonding to the second conductive substrate 200.

The process step of "locally removing and disconnecting the first electrode layer 140 from at least a portion of the groove area 118" is conducted to prevent electrical communication through the first electrode layer 140 between the minor portion 110b and major portion 100a of the luminous structure 110, thereby preventing electrical shorts within the device. Accordingly, an alternative method includes forming a patterned first electrode layer 140, wherein the patterned first electrode layer is a separate first electrode layer 140 for the major portion 100a and a separate first electrode layer 140 for the minor portion 100b, thereby preventing electrical communication between the major and minor portions of the luminous structure. In a further alternative method, the patterned first electrode layer 140 can be formed only on the major portion 100a and not on the minor portion 110b.

For luminous device 9' (FIG. 21A) additional process steps can include the following: (i) doping (e.g., by ion implantation) an additional region 206 (corresponding to the minor portion 110b of the luminous structure) of the conductive substrate 200b in addition to the previously described doping of the region 205 before bonding the conductive substrate; (ii) optionally forming patterned conductive intermediate layers 210 and 211 within the doped regions 205 and 206 of the conductive substrate 200b; (iii) aligning and attaching the patterned conductive intermediate layers 210 and 211 (corresponding to the doped regions 205 and 206) with the portion of the first electrode layer corresponding to the recess 121 in insulating layer 120 and through via contact 145; and any combination of the steps thereof. At least a portion of the doping process for doped region 206 can be conducted simultaneous with the doping process for the doped region 205, and/or the doping process for doped region 206 can be conducted in a separate process step. Furthermore the conductive substrate 200b can be thinned at a later stage (e.g., after bonding) to allow doped region 206 to be exposed on both sides of conductive substrate 200b.

For luminous device 9" (FIG. 21B) additional process steps can include the following: (i) forming a through via contact 212 (e.g., forming a via through conductive substrate 200b and filling the via with a conductive material) corresponding to the minor portion 110b of luminous structure 110, before or after forming doped region 205; (ii) optionally forming patterned conductive intermediate layers 210 and 211 within the doped region 205 of the conductive substrate 200b and corresponding to the through via contact 212; (iii) aligning and attaching the patterned conductive intermediate layers 210 and 211 (corresponding to the doped region 205 and through via contact 212) with the portion of the first electrode layer corresponding to the recess 121 in insulating layer 120 and through via contact 145; and any combination of the steps thereof.

Luminous package 13 (illustrated in FIG. 21A) and luminous package 14 (illustrated in FIG. 21B) can be utilized in a substantially similar way to the hereinbefore described luminous package 12. Luminous package 13 and luminous package 14 are activated (e.g., to emit light) by place a forward bias on the luminous package, e.g., placing a negative bias on the first conductive region 310 and a positive bias on the second conductive region 320. The electrons flow from first conductive region 310 to the through via contact 145 by way of the second n-type doped region 206 or through via contact 212, as illustrated by the dashed arrows on the left side of FIGS. 21A and 21B. When a reverse bias is placed on the luminous package, e.g., placing a positive bias on the first conductive region 310 and a negative bias on the second conductive region 320, electrons will flow from the second conductive region 320 to conductive intermediate layer 210. When the voltage in reverse bias reaches a certain breakdown voltage (e.g., dangerous levels of electrostatic discharge), the zener diode (i.e., the n-type doped region 205 and the p-type conductive substrate 200b) will allow flow of electrons through the n-type doped region 205 and the p-type conductive substrate 200b and exit through first conductive region 310, thereby protecting the luminous device 9', 9".

The embodiments illustrated in FIGS. 19-21B can further include surface texturing (not shown) on the light emitting surface or one lens or a plurality of lenses on the light emitting surface.

Figure 22:
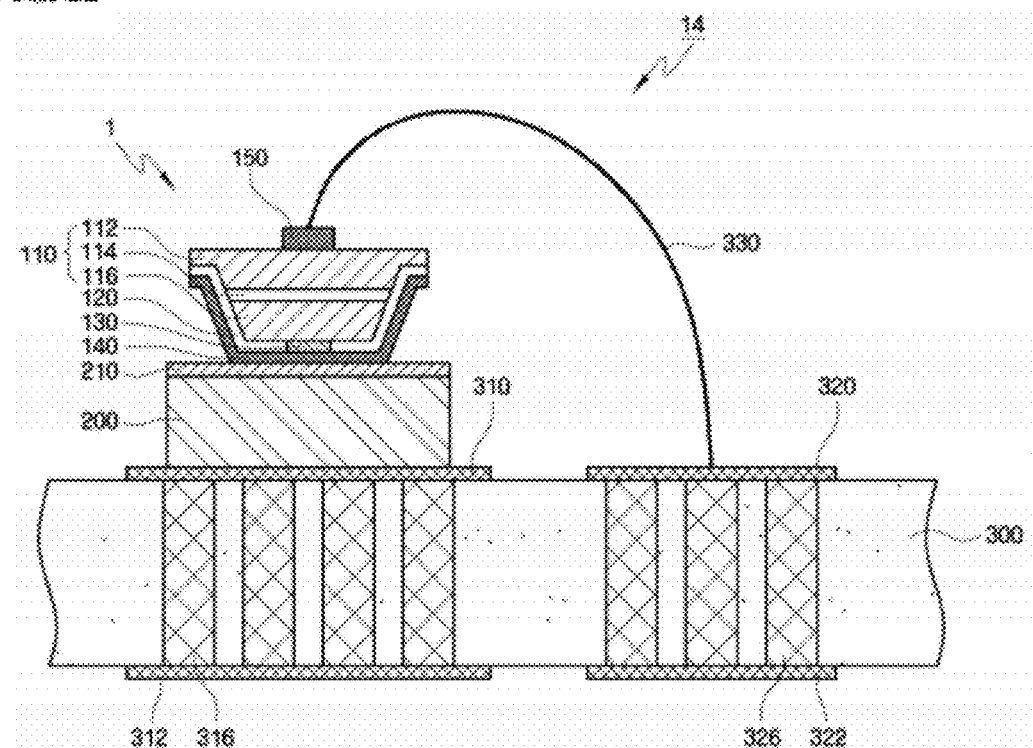
FIG. 22 illustrate another embodiment of a luminous package.

FIG. 22 illustrates another embodiment of an unencapsulated luminous package 15, which comprises a luminous device 1 bound to a first conductive region 310 on a circuit board 300. This embodiment is similar to the embodiment illustrated in FIGS. 17 and 18. Accordingly, like reference numbers identify the same elements (or structures) of the package. The circuit board 300 in this embodiment, however, includes (i) a first surface having the previously described first conductive region 310 and second conductive region 320 and (ii) a second surface having a third conductive region 312 and a fourth conductive region 322. The circuit board 300 further includes (a) at least one first through via 316 connecting the first conductive region 310 and the third conductive region 312 and (b) at least one second through via 326 connect the second conductive region 320 and the fourth conductive region 322. This particular embodiment is beneficial since the through vias 316, 326 allow connection to an external device (e.g., a power source) without requiring additional connections.

FIGS. 23A-23D illustrate various encapsulated embodiments, i.e., encapsulated luminous packages 16-19. Although these figures illustrate the use of the unencapsulated package 10 (illustrated in FIGS. 17 and 18), any of the previously described packages can be similarly encapsulated. Encapsulation provides at least the following benefits: (i) a physical barrier serving as a protection; and (ii) the ability to entrap phosphors, thereby allowing control of the wavelengths of light (e.g., color) being emitted. One or more layers of encapsulation can be used.

Any appropriate encapsulate known to the skilled artisan can be used. Useful materials for encapsulants include, but are not limited to, epoxy, silicone, rigid silicone, urethane, oxethane, acryl, poly-carbonate, polyimide, mixtures thereof, and combinations thereof. It is preferred to use an encapsulant that is (i) substantially transparent to maximize light emission and (ii) flowable in its uncured state.

Similarly, any appropriate phosphor known to the skilled artisan can be used. Appropriate examples of useful phosphors can be found in U.S. Pat. No. 5,998,925 issued on Dec. 7, 1999 to Shimizu et al. and titled "Light Emitting Device Having a Nitride Compound Semiconductor and a Phosphor Containing a Garnet Fluorescent Material," U.S. Pat. No. 7,297,293 issued on Nov. 20, 2007 to Tamaki et al. and titled "Nitride Phosphor and Production Process Thereof, and Light Emitting Device," U.S. Pat. No. 7,247,257 issued on Jul. 24, 2007 to Murazaki et al. and titled "Light Emitting Device," U.S. Pat. No. 7,301,175 issued on Nov. 27, 2007 to Izuno et al. and titled "Light Emitting Apparatus and Method of Manufacturing the Same," U.S. Pat. No. 6,066,861 issued on May 23, 2000 to Hohn et al. and titled "Wavelength-Converting Casting Composition and Its Use," U.S. Pat. No. 6,812,500 issued on Nov. 2, 2004 to Reeh et al. and titled "Light-Radiating Semiconductor Component with a Luminescence Conversion Element," U.S. Pat. No. 6,417,019 issued on Jul. 9, 2002 to Mueller et al. and titled "Phosphor Converting Light Emitting Diode," U.S. Pat. No. 6,891,203 issued on May 10, 2005 to Kozawa et al. and titled "Light Emitting Device," U.S. Pat. No. 7,157,746 issued on Jan. 2, 2007 to Ota et al. and titled "Light Emitting Device Having a Divalent-Europium-Activated Alkaline Earth Metal Orthosilicate Phosphor," and U.S. Pat. No. 6,809,347, issued to Tasch et al. and titled "Light Source Comprising Light-Emitting Element," which are all incorporated herein by reference in their entirety. As discussed hereinbefore, phosphors can convert at least a portion of the light generated by the luminous device into another wavelength of light, thereby allowing changes in the color of light being emitted. For example, white light can be obtained by utilizing a luminous structure emitting blue light and using a phosphor comprising a yellow fluorescent material. Similarly, red phosphor can be utilized to increase the color rendering index.

Figure 23A:
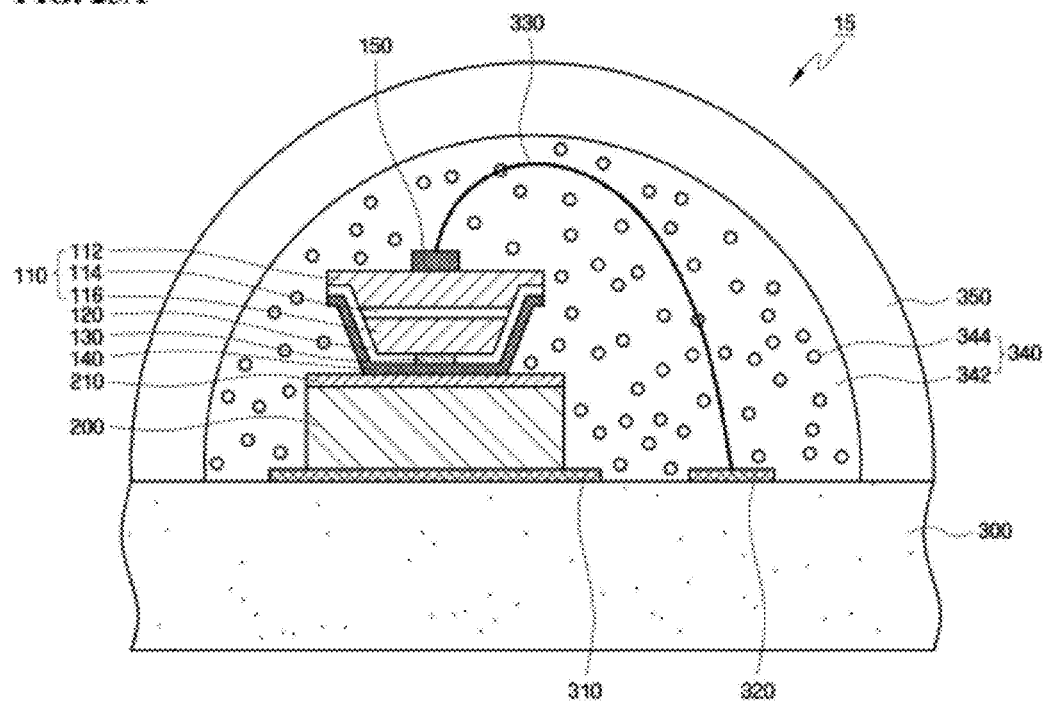
FIGS. 23A-23D illustrate additional embodiments of luminous packages.

FIG. 23A illustrates an encapsulated luminous package 16 comprising the luminous package 10, a phosphor region 340 including a plurality of phosphor particulates 344 encapsulated in a first encapsulant 342, and a second encapsulant 350 encapsulating the phosphor region 340. The first and second encapsulants 342, 350 can be made of the same material or different materials. It is believed that the second encapsulant 350 can prevent damage (e.g., caused by moisture) to phosphor region 340.

Figure 23B:
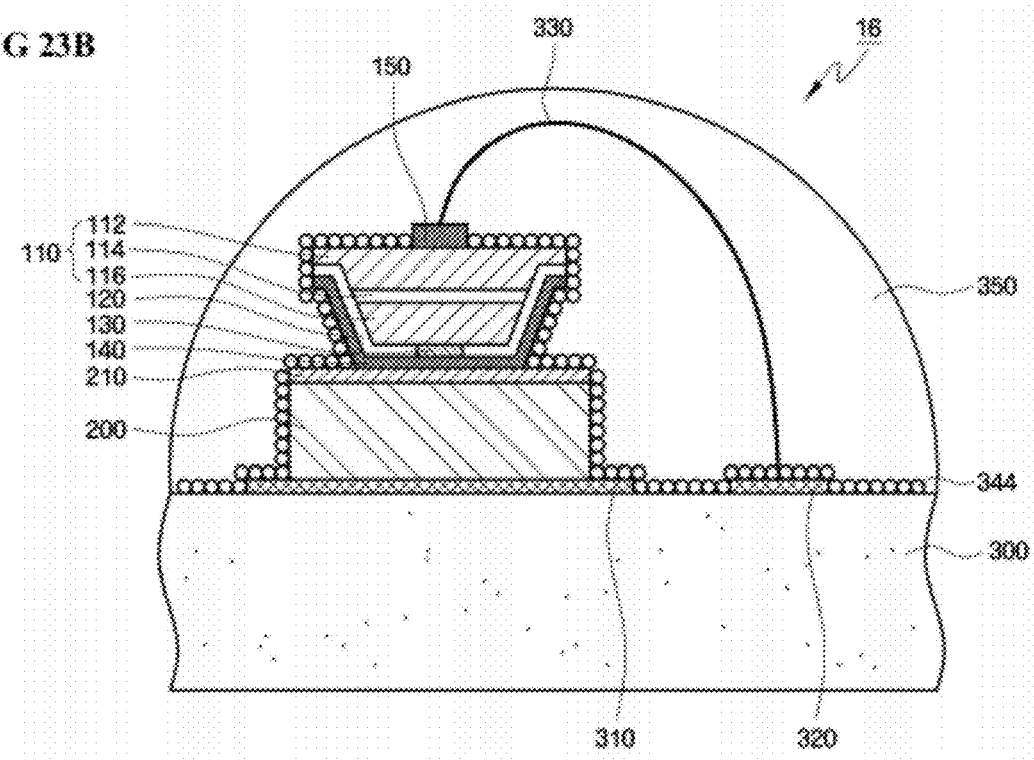

FIG. 23B illustrates an encapsulated luminous package 17 comprising the luminous package 10, a phosphor layer 344, and an encapsulant 350. A thin phosphor layer 344 can be sprayed onto the unencapsulated package 11 before encapsulating the phosphor coated package.

Figure 23C:
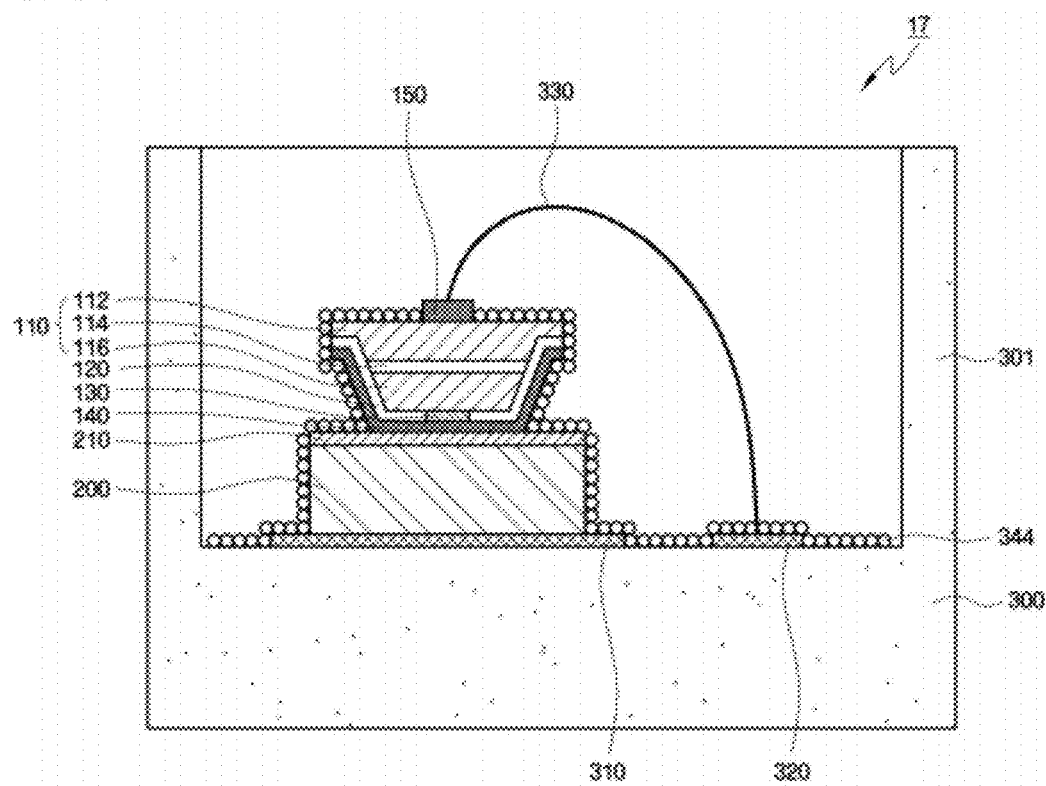

FIG. 23C illustrates an encapsulated luminous package 18 comprising the luminous package 10, a phosphor layer 344, an encapsulant 342, and a modified circuit board 300 having vertically extending side walls 301. Although side walls 301 of the circuit board 300 are straight, side walls 301 can be angled to increase light reflectance and emission. In this embodiment, the side walls 301 are preferably reflective. As illustrated, this embodiment can be utilized without an encapsulant, especially when the luminous package 18 is utilized within an enclosed lighting system. Alternatively, an encapsulant (not shown) and/or a phosphor (not shown) can be added into the enclosure created by circuit board 300 and side walls 301, as previously described.

Figure 23D:
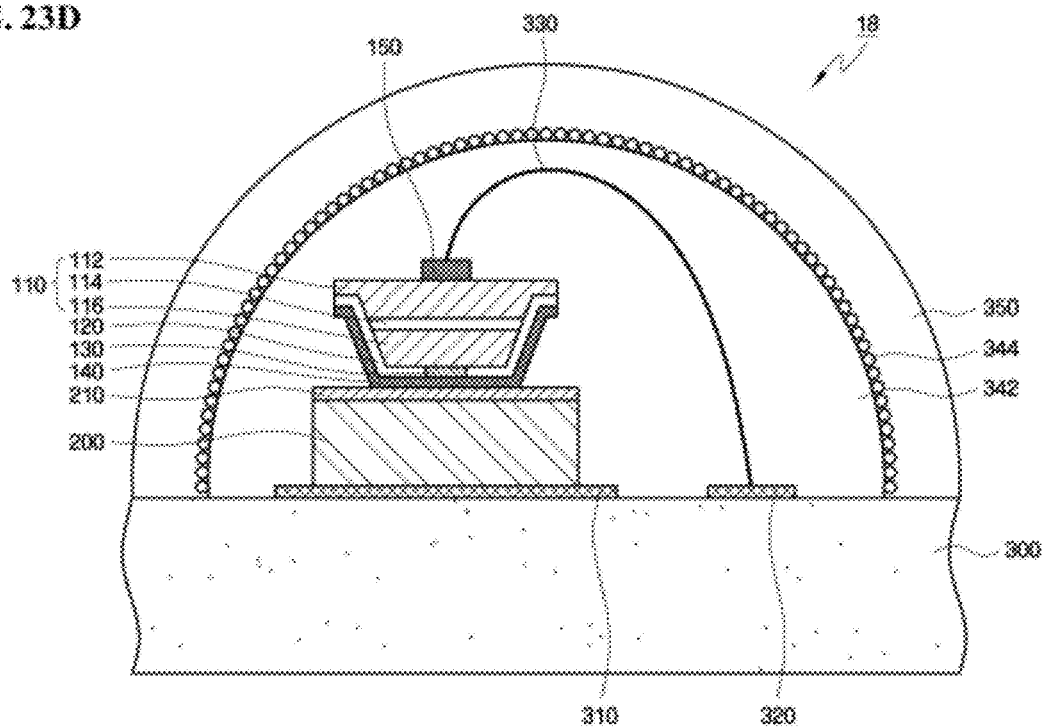

FIG. 23D illustrates an encapsulated luminous package 19 comprising the luminous package 10 encapsulated by a first encapsulant 342, a phosphor layer 344 covering the first encapsulant 342, and a second encapsulant 350 encapsulating the first encapsulant 342 covered by the phosphor layer 344. The first and second encapsulants 342, 350 can be made of the same material or different materials. It is believed that the second encapsulant 350 can prevent damage (e.g., caused by moisture) to phosphor layer 344.

Figure 24:
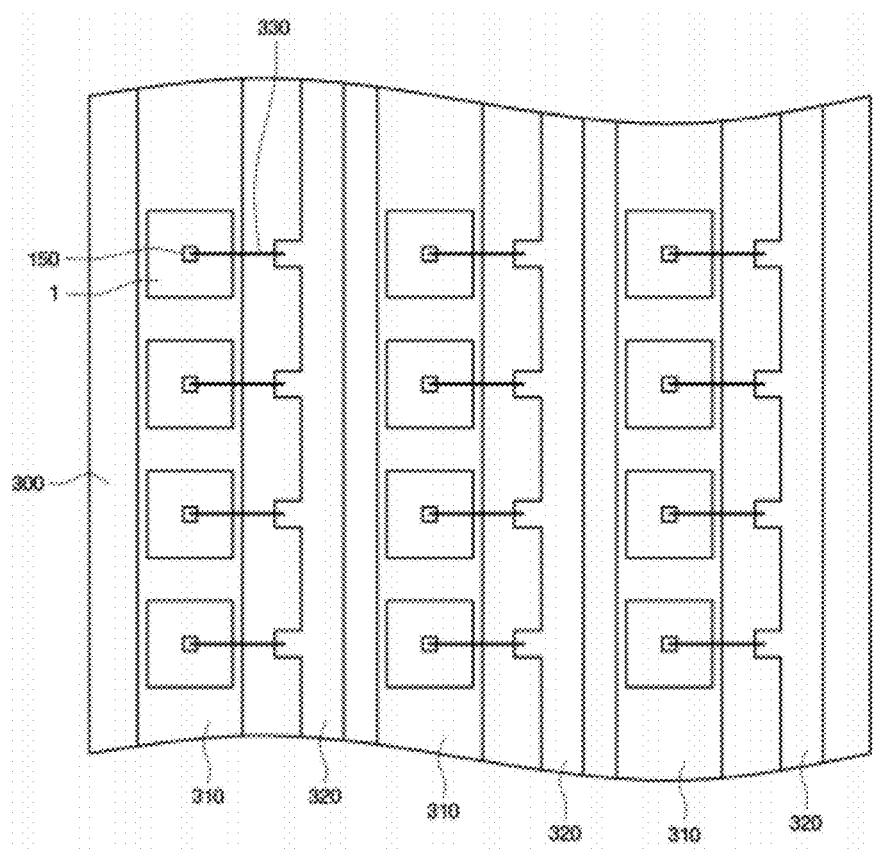
FIGS. 24-26 illustrate various embodiments of an array of luminous packages.
Figure 25:
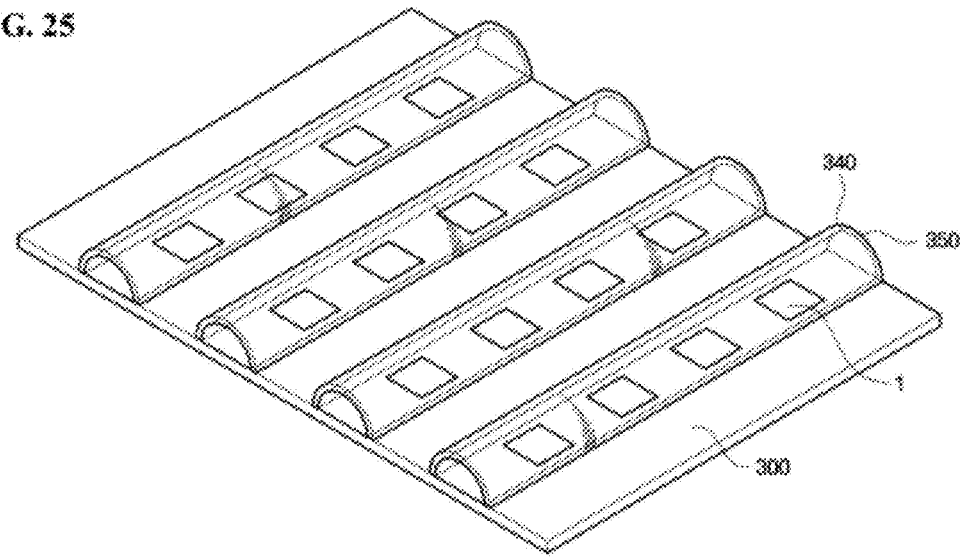
Figure 26:
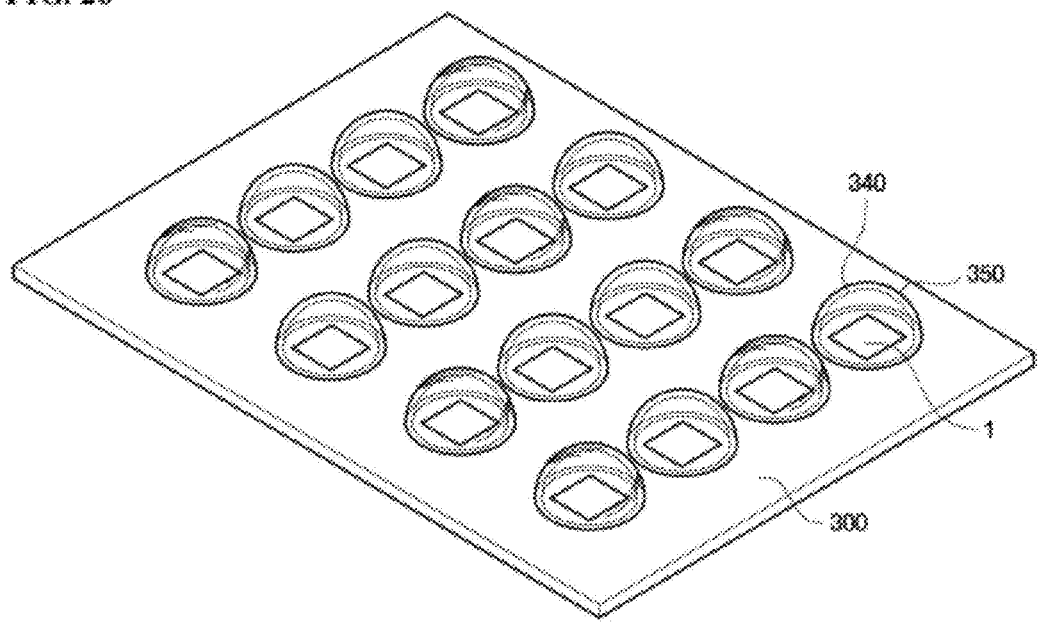

FIGS. 24-26 provide various package configurations providing arrays of luminous devices 1. FIG. 24 illustrates an array of luminous devices 1, wherein subgroups of luminous devices 1 are placed in series. The luminous devices in each subgroup are bound to a common first conductive region 310 on a circuit board 300. The second electrode 150 of each luminous device 1 in each subgroup is electrically connected to a common second conductive region 320 on the circuit board 300. FIG. 25 illustrates such an array of luminous devices 1, wherein each subgroup of luminous devices 1 placed in series is encapsulated by a common phosphor region 340 and/or a common second encapsulate 350. FIG. 26 illustrates such an array of luminous devices 1, wherein each luminous device is individually encapsulated by a phosphor region 340 and/or a second encapsulate 350.

Figure 27:
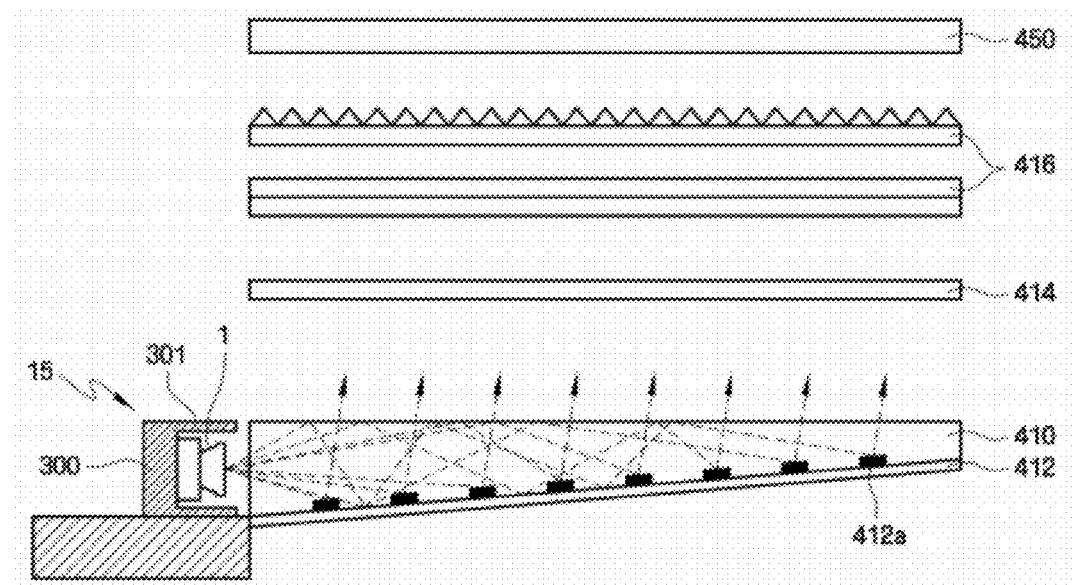
FIGS. 27-31 illustrate various embodiments of systems having one or more luminous packages or arrays of luminous packages.

FIGS. 27-31 illustrate lighting systems comprising the luminous packages and luminous devices of the present invention. FIG. 27 illustrates an LCD panel comprising (i) a luminous package 18 including at least one luminous device 1 mounted on a circuit board 300 having reflective sidewalls 301, (ii) a reflective sheet 412 having patterns 412a, the reflective sheet angled to control reflection of light in a predetermined direction, (iii) a transfer sheet 410, (iv) a spreading sheet 414, (v) at least one prism sheet 416, and (vi) a display panel 450. The reflective sidewalls 301 are not necessary when using the luminous device 1, which provide directional control of the emitted light.

Figure 28:
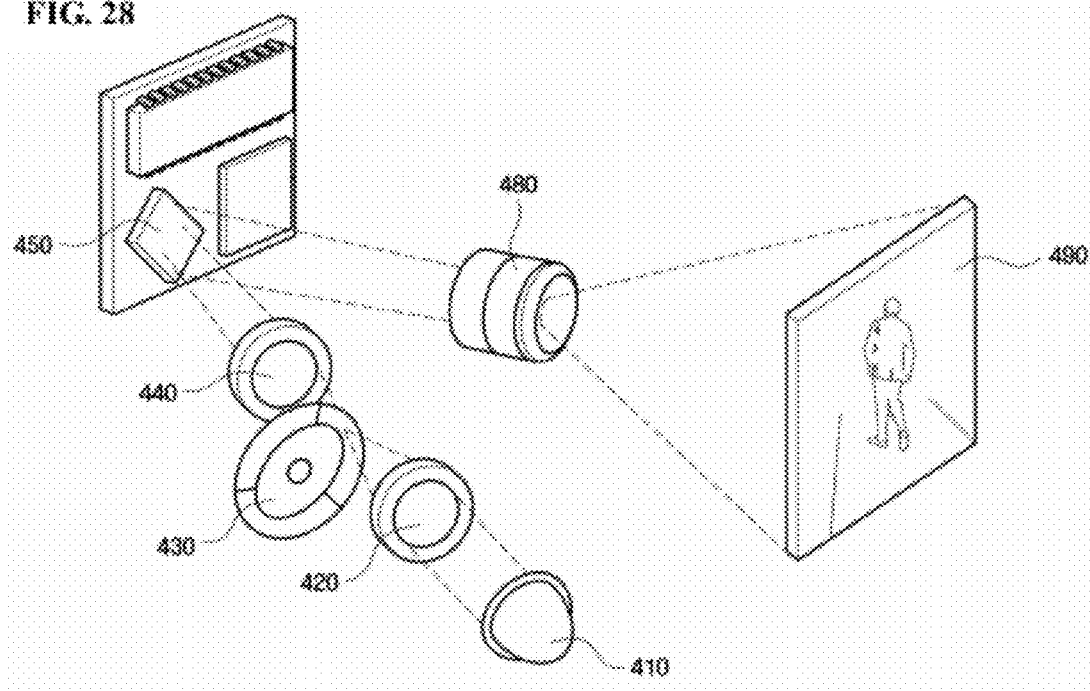

FIG. 28 illustrates a projection system comprising (i) a light source 410 including a luminous package, as described herein, (ii) a condensing lens 420, (iii) a color filter 430, (iv) a sharpening lens 440, (v) a Digital Micromirror Device 450, and (vi) a projection lens 480. The resulting image is projected onto a screen 490.

Figure 29:
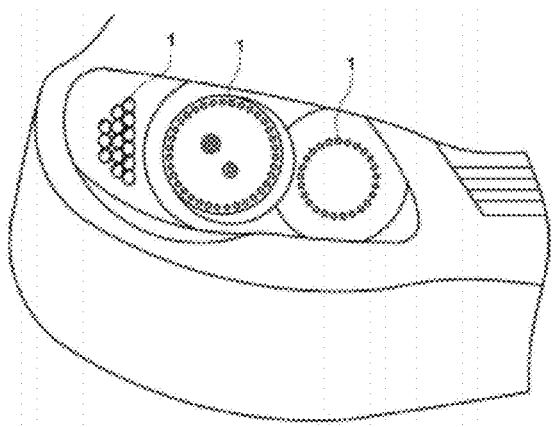
Figure 30:
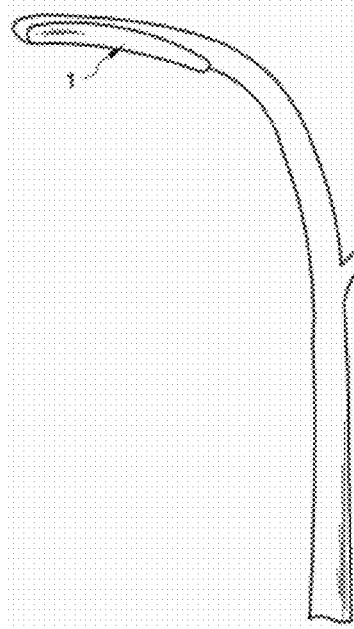
Figure 31:
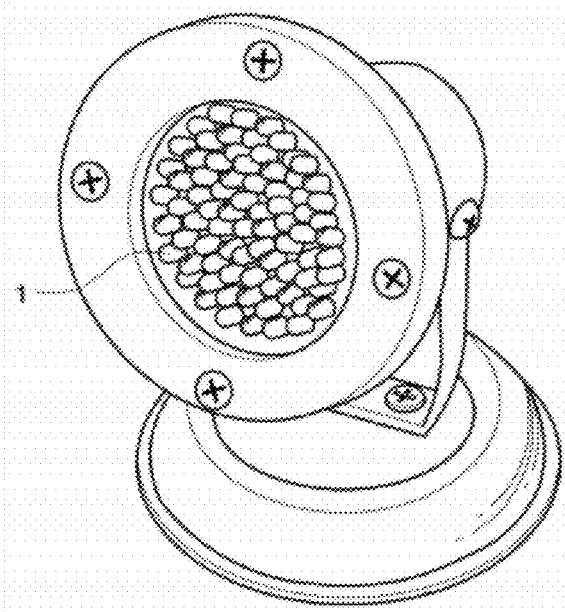

Similarly, FIGS. 29-31 respectively illustrate a headlight of an automobile having luminous packages 10, a street lamp having at least one luminous package 10, and an flood light having at least one luminous package 10.

What is claimed is:

1. A luminous device manufactured by a method of manufacturing a luminous device, the method comprising:
    forming at least one luminous structure on a first substrate, the luminous structure comprising a first cladding layer on the first substrate, an active layer on the first cladding layer, a second cladding layer on the active layer, and at least one inclined side surface comprising the exposed sides of the first cladding layer, the active layer and the second cladding layer;
    forming a patterned insulation layer on the luminous structure, wherein the insulation layer includes a recess exposing a portion of the second cladding layer;
    forming a first electrode layer in the recess and on at least a portion of the insulation layer;
    attaching at least a portion of the first electrode layer to a second conductive substrate;
    removing the first substrate to expose at least one surface of the first cladding layer; and
    forming a second electrode on the exposed surface of the first cladding layer of the luminous structure.

2. A luminous device, comprising:
    a luminous structure having a light emitting first surface, a second surface, at least one side surface inclined at an angle compared to the second surface, an active layer having a first surface and a second surface, a first cladding layer on the first surface of the active layer and providing the first surface of the luminous structure, and a second cladding layer on the second surface of the active layer and providing the second surface of the luminous structure;
    an insulation layer on at least a portion of the at least one side surface and the second surface of the luminous structure, wherein the insulating layer includes a recess exposing at least a portion of the second cladding layer;
    first and second electrodes connected to the luminous structure, wherein the first electrode is in the recess and on at least a majority of the insulation layer; and
    a conductive substrate attached to at least a portion of a surface of the first electrode.

3. The device of claim 2, wherein the insulation layer extends up the side surface of the luminous structure to encompass at least the active layer.

4. The device of claim 2, wherein the insulation layer extends up the entire side surface of the luminous structure.

5. The device of claim 2, wherein the insulation layer is on at least the side surface corresponding to the active layer and the first cladding layer of the luminous structure, and wherein the first electrode layer is on at least the second cladding layer.

6. The device of claim 2, wherein the first electrode layer is on the second cladding layer and on at least a portion of the insulating layer.

7. The device of claim 2, further comprising a groove along the second surface of the luminous structure to provide a major portion of the luminous structure and a minor portion of the luminous structure, wherein the groove separates at least the second cladding layer and the active layer of the luminous structure while provide at least a continuous portion of the first cladding layer, and
    wherein the second electrode is on a first surface of the minor portion of the luminous structure.

8. The device of claim 7, wherein a portion of the first cladding layer of the major portion of the luminous structure has a convex shape, and wherein the second electrode is disposed on the first surface of the minor portion of the luminous structure.

9. The device of claim 7, wherein the conductive substrate comprises a zener diode including a doped region of the conductive substrate, wherein only the doped region is in electrical communication with the first electrode.

10. The device of claim 9, wherein the second conductive substrate further comprises a patterned conductive intermediate layer disposed on and within the doped region of the conductive substrate, and wherein at least a portion of the surface of the first electrode layer is connected to the conductive intermediate layer.

11. The device of claim 2, wherein the first cladding layer comprises a convex-shaped lens portion.

12. The device of claim 2, wherein the conductive substrate comprises a zener diode including a doped region of the conductive substrate, wherein only the doped region is in electrical communication with the first electrode.

13. The device of claim 12, wherein the second conductive substrate further comprises a patterned conductive intermediate layer disposed on and within the doped region of the conductive substrate, and wherein at least a portion of the surface of the first electrode layer is connected to the conductive intermediate layer.

14. A vertical-type luminous device, comprising:
- a luminous structure having a light-emitting first surface, at least one side surface, and a second surface;
- a patterned insulation layer on the second surface and at least a portion of the at least one side surface of the luminous structure, wherein the insulation layer includes a recess exposing a portion of the second surface;
- a substrate supporting the luminous structure;
- a first electrical conduit for connection to a power source;
- a second electrical conduit for connection to the power source;
- a means for electrically connecting the first surface of the luminous structure with the first electrical conduit; and
- a means for electrically connecting the second surface of the luminous structure with the first electrical conduit and for reflecting light impinging on the at least one side surface of the luminous structure.

15. The device of claim 14, wherein the means for reflecting light also conducts heat away from the luminous structure.

* * * * *